(12) United States Patent
Wall et al.

(10) Patent No.: US 12,166,068 B2
(45) Date of Patent: Dec. 10, 2024

(54) ELECTRONIC DEVICE INCLUDING A SEMICONDUCTOR LAYER WITHIN A TRENCH AND A SEMICONDUCTOR LAYER AND A PROCESS OF FORMING THE SAME

(71) Applicant: SEMICONDUCTOR COMPONENTS INDUSTRIES, LLC, Phoenix, AZ (US)

(72) Inventors: Ralph N. Wall, Pocatello, ID (US); Raymond Lappan, Pocatello, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 423 days.

(21) Appl. No.: 17/649,299

(22) Filed: Jan. 28, 2022

(65) Prior Publication Data
US 2023/0282688 A1    Sep. 7, 2023

(51) Int. Cl.
*H01L 29/06* (2006.01)
*H01L 29/10* (2006.01)
(Continued)

(52) U.S. Cl.
CPC ............ *H01L 28/91* (2013.01); *H01L 29/063* (2013.01); *H01L 29/1095* (2013.01);
(Continued)

(58) Field of Classification Search
CPC ................. H01L 21/28; H01L 21/3065; H01L 21/02505; H01L 21/0254; H01L 21/2036;
(Continued)

(56) References Cited

U.S. PATENT DOCUMENTS 6,809,005 B2 * 10/2004 Ranade ............. H10B 12/0387
                                                             257/E21.396
7,285,228 B2    10/2007 Laermer et al.
(Continued)

OTHER PUBLICATIONS

Shimomura et al.; "Process Control Technique to Dramatically Reduce Voids in Phosphorus-Doped Poly-Silicon for Trench Field-Plate MOSFETs"; Joint Symposium 2019—eMDC & ISSM; IEEE; pp. 1-4 (2019).

(Continued)

*Primary Examiner* — Nikolay K Yushin
(74) *Attorney, Agent, or Firm* — Abel Schillinger, LLP

(57) ABSTRACT

In an aspect, a process of forming an electronic device can include patterning a substrate to define a trench having a sidewall and forming a first semiconductor layer within the trench and along the sidewall. In an embodiment, the process can further include forming a barrier layer within the trench after forming the first semiconductor layer; forming a second semiconductor layer within the trench after forming the barrier layer, wherein within the trench, first and second portions of the second semiconductor layer contact each other adjacent to a vertical centerline of the trench; and exposing the second semiconductor layer to radiation sufficient to allow a void within second semiconductor layer to migrate toward the barrier layer. In another embodiment, after forming a semiconductor within the trench, the process can further include forming an insulating layer that substantially fills a remaining portion of the trench.

20 Claims, 12 Drawing Sheets

(51) Int. Cl.
    *H01L 29/66*         (2006.01)
    *H01L 29/78*         (2006.01)
    *H01L 29/788*       (2006.01)
    *H01L 49/02*         (2006.01)

(52) U.S. Cl.
    CPC .................. *H01L 29/66681* (2013.01); *H01L 29/66825* (2013.01); *H01L 29/7816* (2013.01); *H01L 29/7883* (2013.01)

(58) Field of Classification Search
    CPC ......... H01L 28/91; H01L 28/24; H01L 28/20; H01L 29/063; H01L 29/06; H01L 29/1095; H01L 29/10; H01L 29/66681; H01L 29/66; H01L 29/66825; H01L 29/78; H01L 29/7883; H01L 29/788; H01L 29/40114; H01L 29/66659; H01L 29/7835; H01L 29/7816
    See application file for complete search history.

(56) References Cited

U.S. PATENT DOCUMENTS

| | | | |
|---|---|---|---|
| 8,198,196 | B1 | 6/2012 | Murphy et al. |
| 8,492,260 | B2 | 7/2013 | Parsey, Jr. et al. |
| 8,981,533 | B2 | 3/2015 | Grivna |
| 9,812,354 | B2 | 11/2017 | Grivna et al. |
| 10,153,213 | B2 | 12/2018 | Agam et al. |
| 2008/0124889 | A1 | 5/2008 | Roggenbbauer et al. |
| 2014/0070375 | A1* | 3/2014 | Grivna .............. H01L 21/76898 257/621 |

OTHER PUBLICATIONS

Dao et al.; "Improved Deep Trench Isolation Breakdown Voltage for SmartMOS"; ICICDT 2013; IEEE; pp. 101-103 (2013).

* cited by examiner

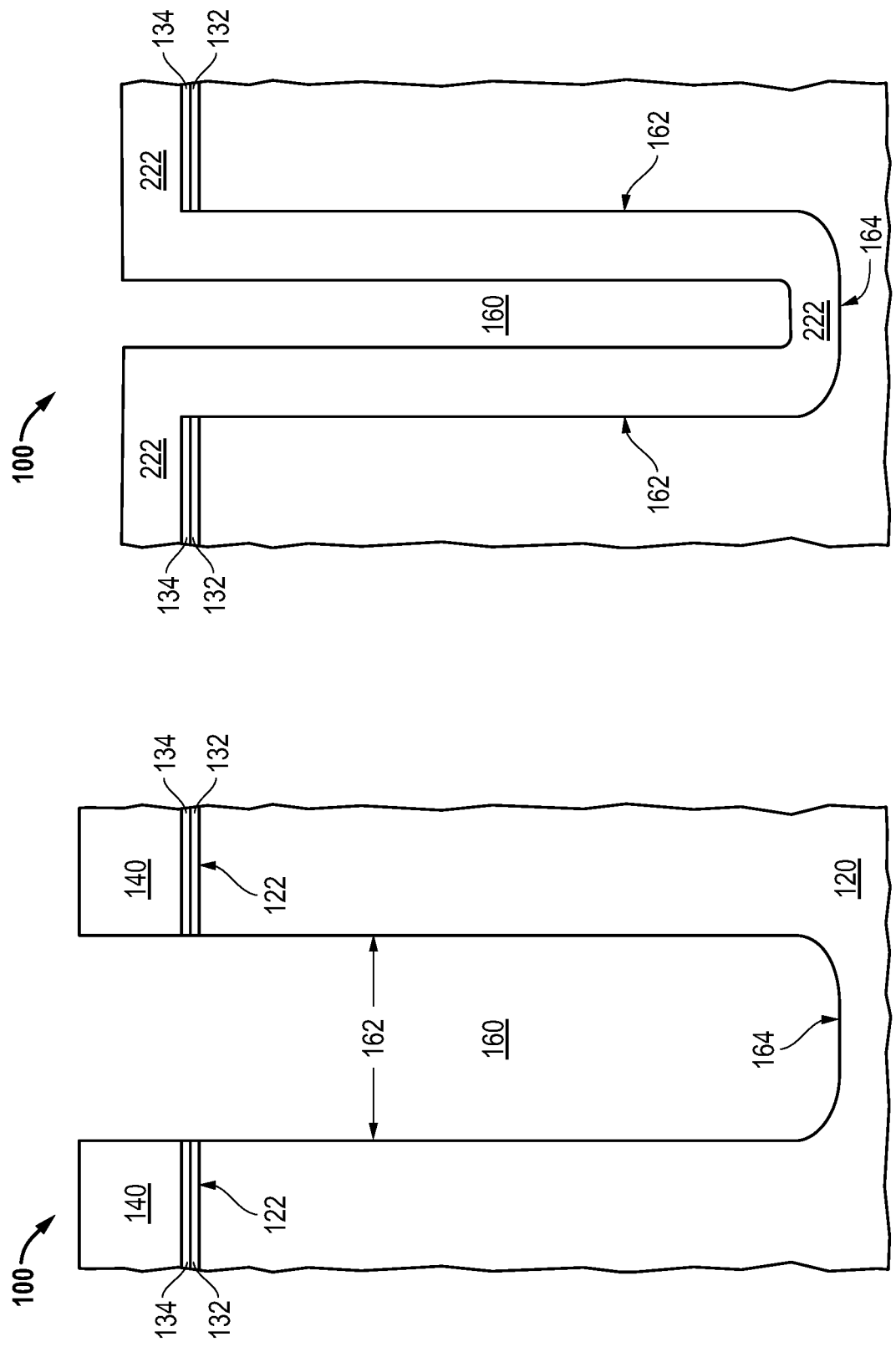

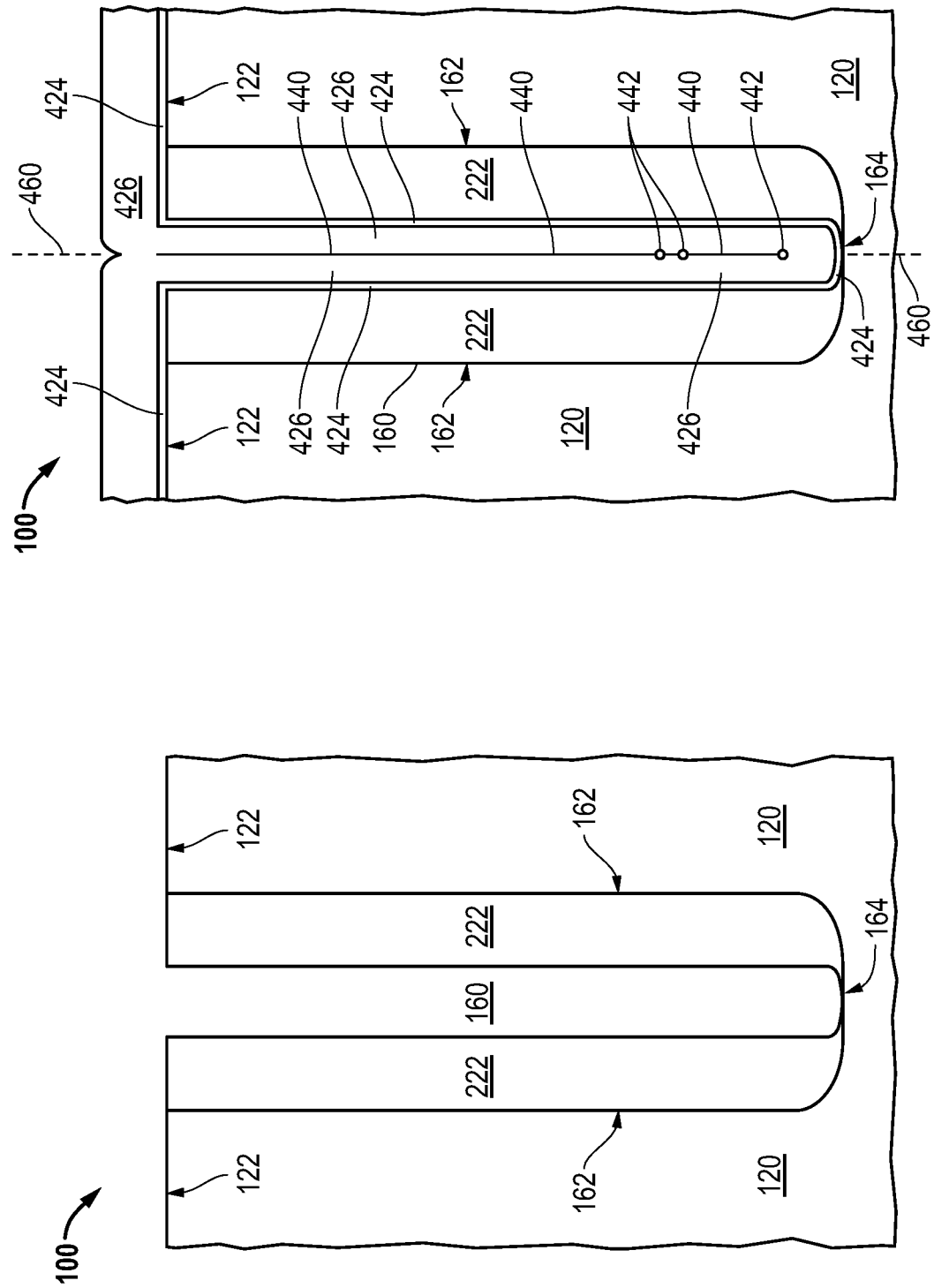

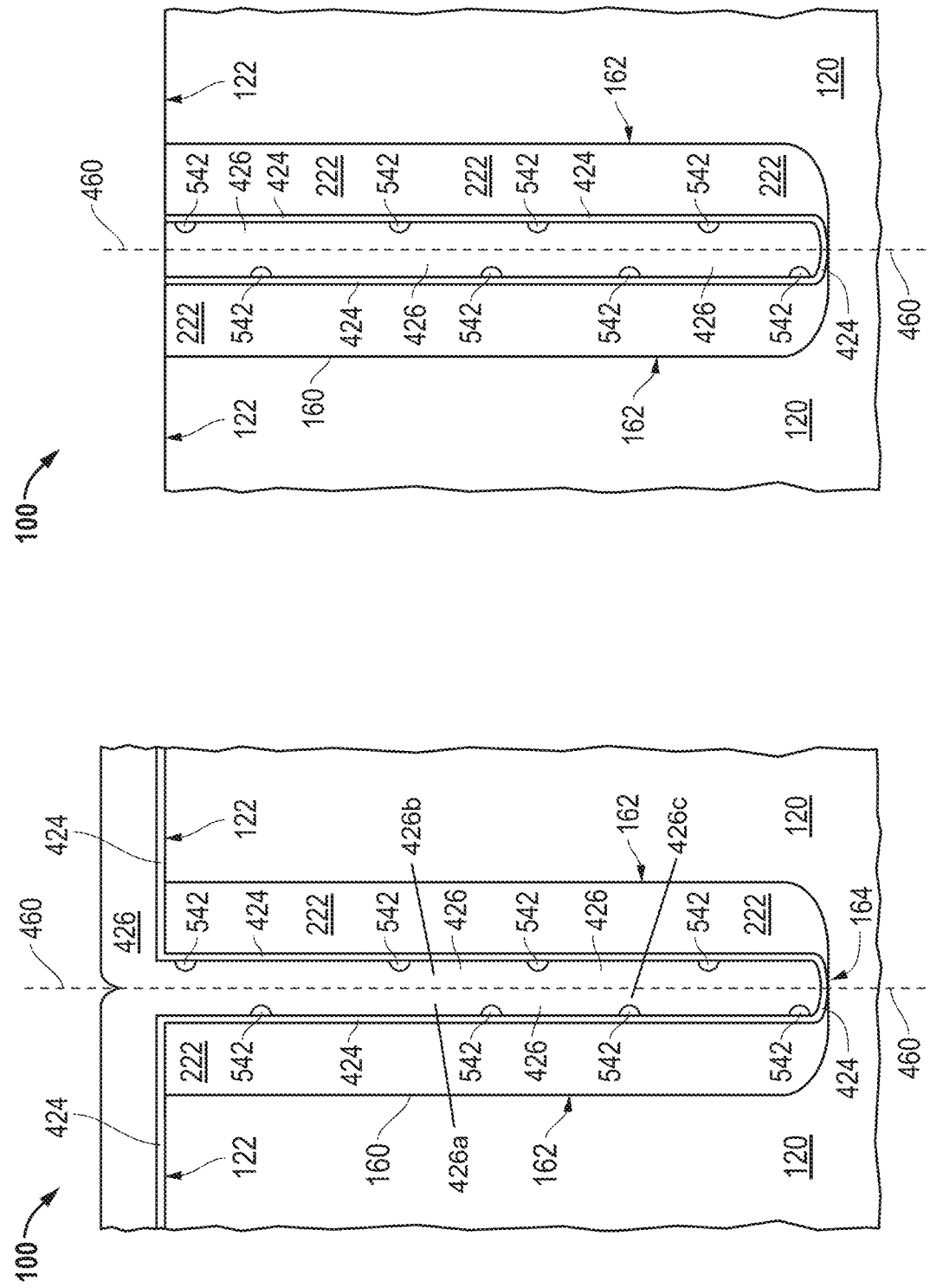

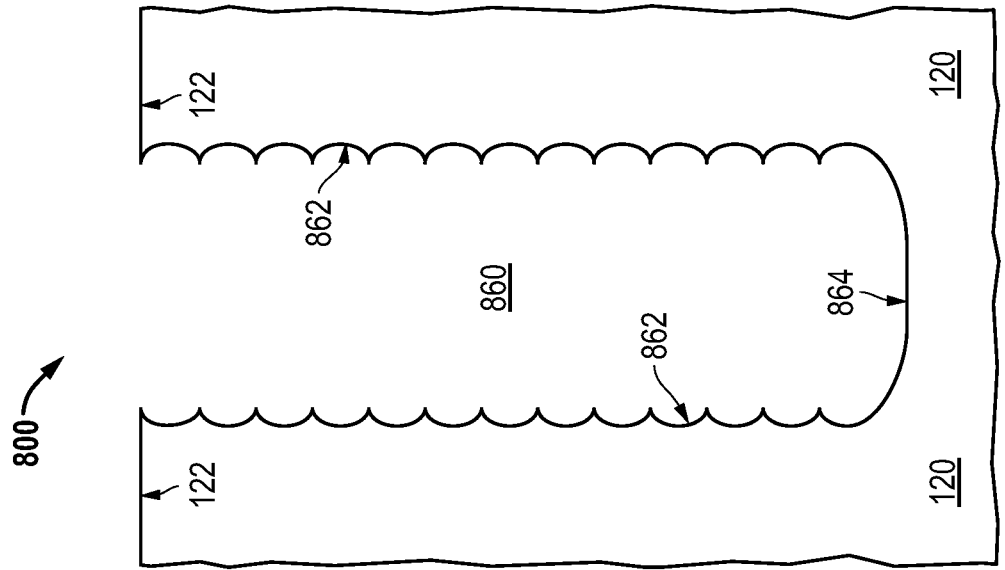
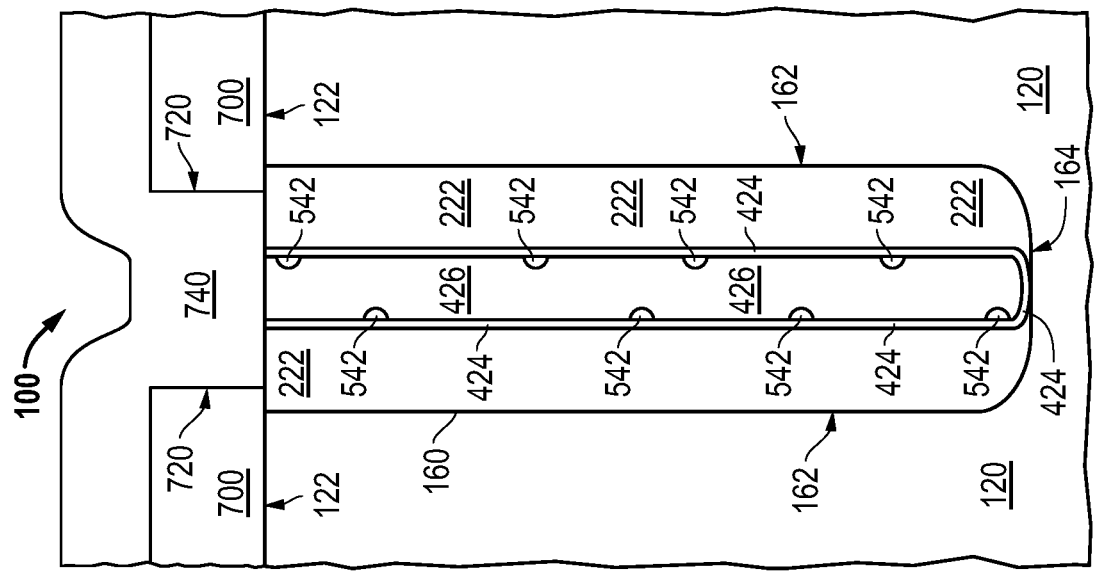

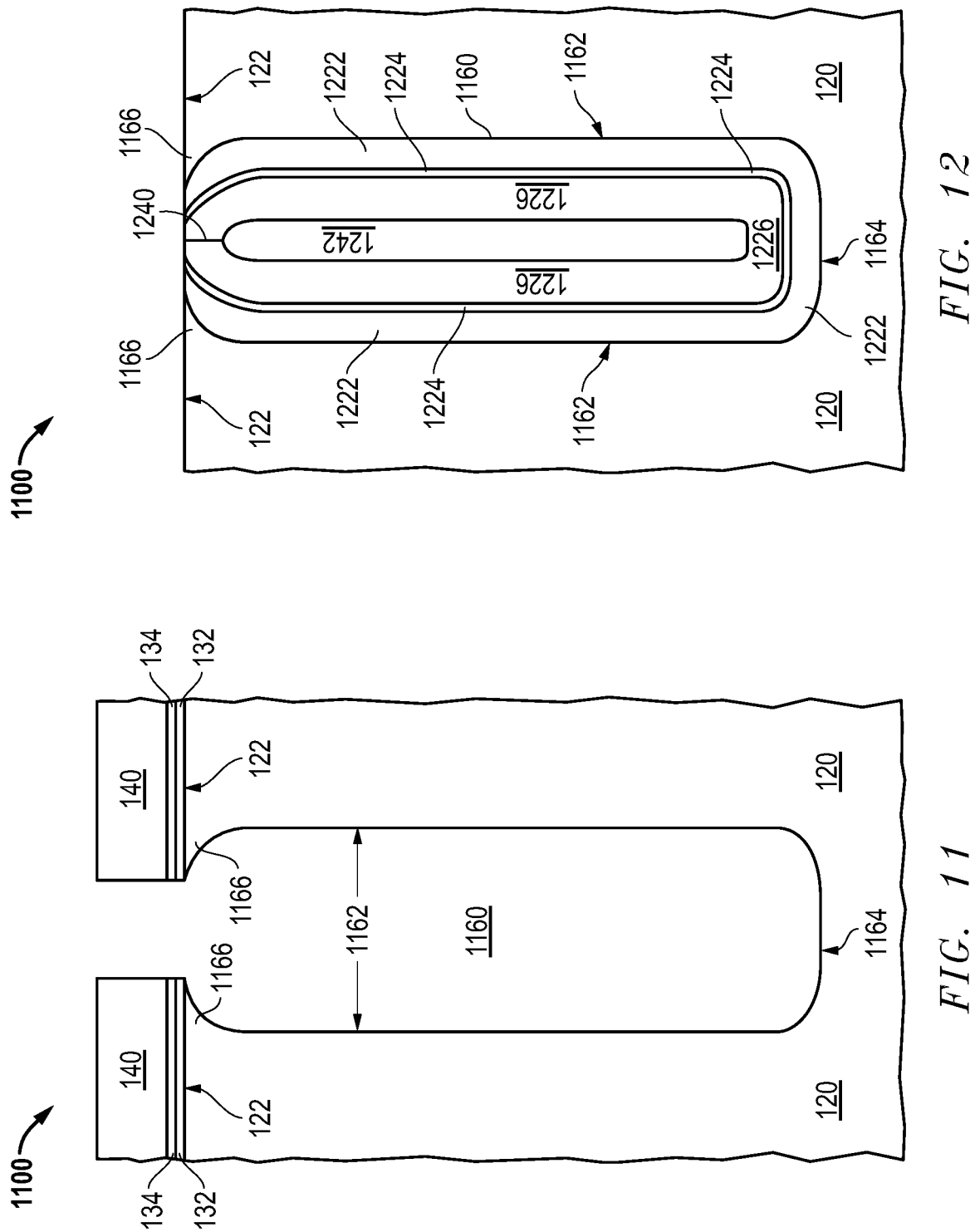

ELECTRONIC DEVICE INCLUDING A SEMICONDUCTOR LAYER WITHIN A TRENCH AND A SEMICONDUCTOR LAYER AND A PROCESS OF FORMING THE SAME

FIELD OF THE DISCLOSURE

The present disclosure relates to electronic devices and processes, and more particularly to, electronic devices that include semiconductor layers within trenches and processes of forming such electronic devices.

RELATED ART

Polycrystalline silicon (polysilicon) is frequently used to fill trenches in electronic devices. The polysilicon can be used as a conductor, such as a gate feed, or a capacitor electrode, or as a dopant source for doping a sidewall of a trench, or a non-conducting mechanical filler material, etc. Any voids that form within a polysilicon layer at or near the trench sidewall can cause disruptions, discontinuities, defects, and variation in the desired device function. Voids are typically formed from a seam in the polysilicon during deposition when the polysilicon surfaces contact each other. Upon subsequent temperature processing, the seam tends to coalesce into discrete voids, and if given sufficient energy, the voids will move toward the trench sidewall interface as Gibbs free energy is minimized.

Methods can be used to attempt to eliminate the voids. Methods include tapering the etch profile of the trench, increasing the dopant concentration of the polysilicon, increasing the anneal time and temperature for the polysilicon, layering with multiple polysilicon depositions, adjusting polysilicon deposition conditions (e.g., depositing the silicon as amorphous silicon (at a lower deposition temperature) and crystallization to form polysilicon), modifying a nucleation and growth surface, etc. These attempts to address the voids do not completely solve the problem or interfere with other aspects of the process architecture and process integration.

An electronic device having a semiconductor layer that is substantially free of voids along an interface at or near a sidewall of a trench is desired.

BRIEF DESCRIPTION OF THE DRAWINGS

Embodiments are illustrated by way of example and are not limited in the accompanying figures.

FIG. 1 includes an illustration of a cross-sectional view of a portion of a workpiece that includes a substrate, a pad layer, an oxidation-resistant layer, and a patterned masking layer after patterning the substrate to define openings extending through the pad and oxidation-resistant layers and a trench extending into the substrate.

FIG. 2 includes an illustration of a cross-sectional view of the workpiece of FIG. 1 after removing the patterned masking layer and forming a semiconductor layer within the trench.

FIG. 3 includes an illustration of a cross-sectional view of the workpiece of FIG. 2 after removing portions of the semiconductor layer outside of the trench.

FIG. 4 includes an illustration of a cross-sectional view of the workpiece of FIG. 3 after forming a barrier layer and another semiconductor layer.

FIG. 5 includes an illustration of a cross-sectional view of the workpiece of FIG. 4 after performing a thermal operation that forms voids along the barrier layer.

FIG. 6 includes an illustration of a cross-sectional view of the workpiece of FIG. 5 after removing portions of the barrier layer and the other semiconductor layer outside the trench.

FIG. 7 includes an illustration of a cross-sectional view of the workpiece of FIG. 6 after forming a substantially completed electronic device.

FIG. 8 includes an illustration of a cross-sectional view of a portion of a workpiece that includes a substrate after patterning the substrate to define a trench extending into the substrate.

FIG. 11 includes an illustration of a cross-sectional view of a portion of a workpiece that includes a substrate after patterning the substrate to define a trench extending into the substrate, wherein the trench has a reentrant angle near a primary surface of the trench.

FIG. 12 includes an illustration of a cross-sectional view of the workpiece of FIG. 11 after forming a semiconductor layer, a barrier layer, and another semiconductor layer.

Figure 10:
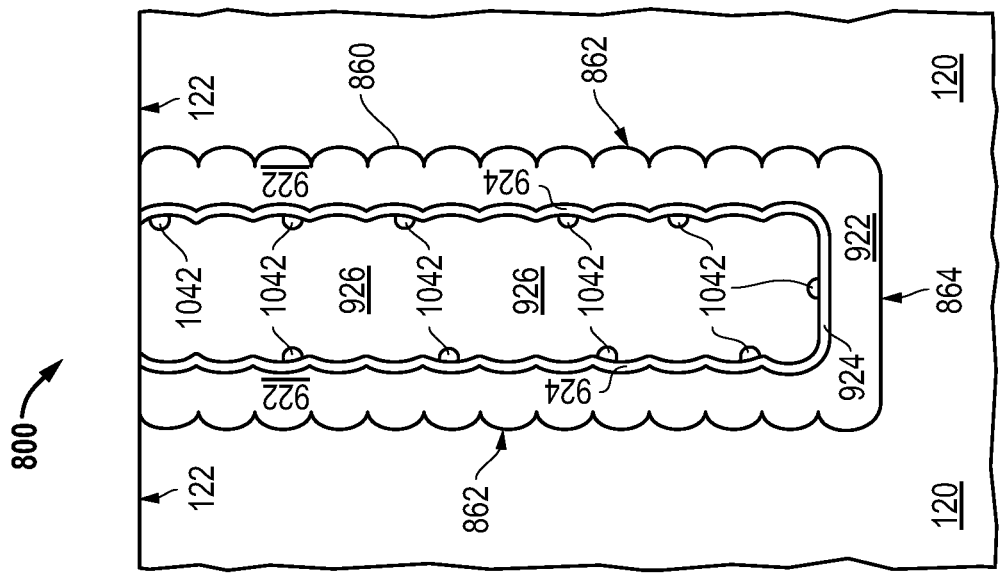
FIG. 10 includes an illustration of a cross-sectional view of the workpiece of FIG. 9 after performing a thermal operation that forms voids along the barrier layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "base semiconductor material" is intended to mean a semiconductor material without regard to the presence, absence, or type of an aliovalent dopant with respect to the semiconductor material. For example, n-type doped Si and p-type doped Si have Si as the base semiconductor material. Unintentionally doped GaN, p-type doped GaN, and n-type doped GaN all have GaN as the base semiconductor material. GaN and $Al_aGa_{(1-a)}N$, where $0.1<a\leq1$, are different base semiconductor materials.

The term "horizontal" is in a direction along or parallel to a primary surface of a substrate or layer, and the term "vertical" is in a direction perpendicular to the primary surface.

With respect directions, the term "lateral" and its variants refer to a direction or dimension along a primary surface of a workpiece or a plane along or parallel to the primary surface. The primary surface may correspond to a surface of a layer or a substrate within a workpiece. Two components may lie at different elevations and be separated by a distance in an x-axis, a y-axis or both the x- and y-axes, where the x- and y-axes are perpendicular to each other. Lateral dimensions do not consider vertical, or z-axis, offsets.

The term "metal," with respect to elements within the Periodic Table of the Elements, is intended to mean an element that is within any of the Groups 1 to 12 and, within Groups 13 to 16, an element that is along and below a line defined by atomic numbers 13 (Al), 31 (Ga), 50 (Sn), 51 (Sb), and 84 (Po). A metal element does not include Si or Ge.

Group numbers correspond to columns within the Periodic Table of Elements based on the IUPAC Periodic Table of Elements, version dated Dec. 1, 2018.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor dopant concentrations) for the value are reasonable differences from the ideal goal of exactly as described.

The term "significantly different" is intended to mean that a value of a variable (e.g., length, width, etc.) is greater ten percent (10%) (and more than twenty percent (20%) for semiconductor dopant concentrations) as compared to a different value of the same variable.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A process can form a substantially void-free semiconductor layer within a trench. In an embodiment, a barrier layer can be formed to substantially prevent voids within one semiconductor layer from migrating into the void-free semiconductor layer. In another embodiment, a semiconductor layer can partially, and not completely, fill a trench, and an insulating layer can fill a remainder of the trench. A seam or voids that may form within the insulating layer will remain in the insulating layer and will not migrate into the semiconductor layer. Electronic devices formed using the process can have electronic characteristics that are more reproducible from substrate to substrate and from production lot to production lot.

In an aspect, a process of forming an electronic device can include patterning a substrate to define a trench having a sidewall; forming a first semiconductor layer within the trench and along the sidewall; forming a barrier layer within the trench after forming the first semiconductor layer; and forming a second semiconductor layer within the trench after forming the barrier layer. Within the trench, first and second portions of the second semiconductor layer contact each other adjacent to a vertical centerline of the trench. The process can further include exposing the second semiconductor layer to radiation sufficient to allow a void within second semiconductor layer to migrate toward the barrier layer.

In another aspect, a process of forming an electronic device can include patterning a substrate to define a trench having a sidewall; forming a semiconductor layer within the trench and along the sidewall, wherein the semiconductor layer is an only semiconductor layer formed within the trench; forming an insulating layer that substantially fills a remaining portion of the trench; and exposing the semiconductor layer to radiation sufficient to allow self-diffusion of a base semiconductor material within the semiconductor layer. In a finished electronic device, within the trench, no void is not completely surrounded by the semiconductor layer.

In a further aspect, an electronic device can include a substrate the defines a trench having a sidewall; a first semiconductor layer within the trench and along the sidewall of the trench, wherein the first semiconductor layer is substantially free of any void; a barrier layer within the trench; and a second semiconductor layer within the trench. The barrier layer can be disposed between the first semiconductor layer and the second semiconductor layer, first and second portions of the second semiconductor layer can contact each other at a location closer to a vertical centerline of the trench as compared to the barrier layer. A void can be within the second semiconductor layer, and, at a particular elevation, a third portion of the second semiconductor layer is disposed between the void and the vertical centerline of the second semiconductor layer.

FIG. 1 includes a cross-sectional view of a portion of a workpiece 100 that includes a substrate 120, a pad layer 132, an oxidation-resistant layer 134, a patterned masking layer 140, and a trench 160. The substrate 120 can have a base semiconductor material that includes a Group 14 material, such as Si or Ge. In another embodiment, a different base semiconductor material can be used, such as a compound semiconductor material. A compound semiconductor material can include sapphire (monocrystalline $Al_2O_3$), silicon carbide (SiC), gallium nitride (GaN), aluminum nitride (AlN), gallium oxide ($Ga_2O_3$), spinel ($MgAl_2O_4$), another suitable substantially monocrystalline material, or the like. In an embodiment, the substrate 120 can have a diameter or a width of at least 200 mm, 300 mm, 400 mm, or greater. In a particular embodiment, the diameter or width can be in a range from 200 mm to 400 mm. In another embodiment, the dimension or width can be smaller. In an embodiment, the substrate can be in the form of a wafer.

The substrate 120 can have a substantially uniform composition or the composition, such as a dopant concentration, may vary. Although not illustrated, the substrate 120 can have a buried region, such as a buried doped region or a buried oxide layer and one or more epitaxial layers overlying the buried region. In an embodiment, the doped buried region can be a heavily doped wafer or may be a heavily doped buried layer overlying a more lightly doped wafer. The substrate 120 may be n-type or p-type doped. Many other embodiments for the substrate are possible. The substrate 120 has a primary surface 122.

The pad layer 132 can include an oxide and have a thickness in a range from 5 nm to 90 nm. The oxidation-resistant layer 134 can include a nitride and have a thickness in a range from 50 nm to 500 nm. In another embodiment, the pad layer 132, the oxidation-resistant layer 134, or both may not be used. In a further embodiment, one or more other layers may be used in conjunction with or as alternative to one or both of the pad layer 132 and oxidation-resistant layer 134. In another embodiment, the pad layer 132 and the oxidation-resistant layer 134 may not be formed.

The patterned masking layer 140 is formed over the substrate 120, and if present, over the pad layer 132 and the oxidation-resistant layer 134. An opening within the patterned masking layer 140 corresponds to the location of the trench 160. The substrate 120, the pad layer 132, and the oxidation-resistant layer 134 are patterned to define openings extending through the pad layer 132 and the oxidation-resistant layer 134 and extending into the substrate 120 to define the trench 160.

The trench 160 has a sidewall 162 and a bottom 164. The depth of the trench 160 is measured as the vertical distance from the primary surface 122 to the bottom 164 of the trench 160. The width of the trench 160 may be measured at the primary surface 122 or at an elevation below the primary surface 122, such as 0.2 micron below the primary surface (just in case there is slight corner rounding of the substrate 120 near the primary surface 122. The width of the trench 160 may be an average width of the trench at elevations between the primary surface 122 to a location where corner rounding near the bottom 164 of the trench 160 begins. As used hereinafter, the width of the trench 160 is measured at the primary surface 122 unless explicitly stated otherwise.

The geometry of the trench 160 can have a significant impact on voids that may form during a subsequent operation that fills or seals off the trench 160. Reentrant openings and other shapes for the trench 160 are described with respect to other embodiments later in this specification. Trenches having an aspect ratio of 1:1 (depth:width) may not have a problem with voids. Voids become more significant as the trench 160 becomes deeper, has a higher aspect ratio, or both. Although not intended to be limiting, issues with voids can be significant with a trench depth of at least 2.0 microns, an aspect ratio of at least 1.5:1, or both. In an embodiment, the trench depth can be in a range from 2.0 microns to 90 microns, 2.5 microns to 20 microns, or 3.0 microns to 9.0 microns. In the same or different embodiment, the aspect ratio can be in a range from 1.5:1 to 50:1, 2.0:1 to 20:1, or 2.5:1 to 9:1. Other depths and aspect ratios may be used without deviating from the concepts as described herein.

The depth and aspect ratio for the trench 160 may be selected to in accordance with a particular purpose, such as forming an electrical connection to a buried doped region, a through-substrate via, sidewall doping from a subsequently-formed doped layer, as part of an isolation structure, or another application. After reading this specification, skilled artisans will be able to determine a depth and aspect ratio for the trench 160 in order to meet the needs or desires for a particular application. The patterned masking layer 140 is removed after patterning the substrate 120 to define the trench 160. The pad layer 132 and the oxidation-resistant layer 134 can be removed at this time or later in the process.

A semiconductor layer 222 can be formed within the trench 160, as illustrated in FIG. 2. The semiconductor layer 222 fills a part, and not all, of the trench 160. The semiconductor layer can include a Group 14 element, and in an embodiment, has the same base semiconductor material as the substrate 120. For example, the substrate 120 and the semiconductor layer 222 can have Si as their base semiconductor material.

The semiconductor layer 222 can be doped or undoped. In an embodiment, the semiconductor layer 222 may be n-type doped or p-type doped. When doped, the semiconductor layer may be doped in-situ or during a separate doping operation, such as using a tilt angle implant or furnace doping. The dopant concentration of the semiconductor layer 222 may be substantially the same as or significantly different from the dopant concentration along the sidewall 162 of the trench 160. The dopant concentration of the semiconductor layer 222 may be at least $1 \times 10^{19}$ atoms/cm$^3$ when an ohmic contact is to be formed to the semiconductor layer 222 or when the semiconductor layer 222 is a dopant source, for example, to introduce a dopant into the substrate 120 along the sidewall 162 of the trench 160. In another embodiment, the dopant concentration may be significantly lower, such as in a range from $1 \times 10^{15}$ atoms/cm$^3$ to $5 \times 10^{17}$ atoms/cm$^3$. After reading this specification, skilled artisans will be able to determine a dopant concentration for the semiconductor layer 222 to meet the needs or desired for a particular application.

The semiconductor layer 222 can be deposited within the trench 160 and over the primary surface 122 of the substrate 120. When the pad layer 132 and oxidation-resistant layer 134 are present, the semiconductor layer 222 can be deposited over the oxidation-resistant layer 134.

The semiconductor layer 222 can remain over the primary surface 122 of the substrate 120 outside of the trench 160 or the portion of the semiconductor layer 222 outside of the trench 160 can be removed at this point in the process. Stress, process integration, or both may affect the decision whether or when to remove the portion of the semiconductor layer 222 outside of the trench 160. As the substrate 120 becomes larger, issues with stress can increase exponentially. At a substrate diameter below 150 mm, the stress issues may not be too significant. However, at 150 mm, the issues with stress may become significant. The issues exponentially increase with a linear increase in diameter. When the substrate diameter is 200 mm, the issues can become substantial, and be even substantially greater at a diameter of 300 mm and higher. If the stress with the semiconductor layer 222 is unacceptably high, the portion of the semiconductor layer 222 outside of the trench 160 can be removed.

The removal may be performed using an etch or a planarization technique, such as chemical-mechanical polishing (CMP). When an etch is used, a portion of the semiconductor layer 222 near the bottom 164 of the trench 160 may also be removed, as illustrated in FIG. 3. If the portion of the semiconductor layer 222 near the bottom 164 of the trench 160 is to remain, a layer can be formed within the trench 160 before the etch. The layer may or may not be removed after the portion of the semiconductor layer 222 outside of the trench 160 is removed. In a non-limiting embodiment, a resist layer can be formed over the semiconductor layer and within the trench 160. A resist etch-back process can be performed to remove portions of the resist layer and the semiconductor layer 222 outside of the trench. The remaining portion of the resist layer within the trench 160 can then be removed.

For CMP, the oxidation-resistant layer 134 may help with endpoint detection or reduce the likelihood of removing too much of the substrate 120 (as compared to a situation when the pad layer 132 and oxidation-resistant layer 134 were not present).

In another embodiment, a selective deposition, such as selective epitaxy, may be used to form the semiconductor layer 222 within the trench 160. Such selective deposition does not form any significant portion of the semiconductor layer 222 over the oxidation-resistant layer 134.

At this point in the process, remaining portions of the pad layer 132 and the oxidation-resistant layer 134, if formed and not yet removed, may be removed at this time. The pad and oxidation-resistant layers 132 and 134 are removed from the workpiece in embodiment illustrated in FIG. 3.

In FIG. 4, a barrier layer 424 and a semiconductor layer 426 are formed within the trench 160 and over the primary surface 122 of the substrate 120. The semiconductor layer 426 can have a seam 440 or one or more voids 442 formed near a vertical centerline 460 (illustrated by a dashed line) of the trench 160. As will be described in more detail later is this specification, voids may be formed from trapped gas along the seam 440. The one or more of the voids 442 or subsequently-formed smaller voids may migrate to interfaces with a material dissimilar to the semiconductor layer 426. The barrier layer 424 helps to reduce the likelihood that any voids reach the surface of the semiconductor layer 222 closest to the sidewall 162 of the trench 160.

The barrier layer 424 can include a material that does not significantly react with the semiconductor layers 222 and 426. In an embodiment, the barrier layer 424 can include one or more films that include an oxide, a nitride, or an oxynitride. The one or more films may be thermally grown, deposited, or a combination thereof. For example, a first film may be grown from portions of the semiconductor layer 222 and substrate 120, and a second film may be deposited over the first film. The barrier layer 424 can have a thickness sufficient to substantially reduce or eliminate the possibility that a void within the semiconductor layer 426 will reach the semiconductor layer 222. As the thickness increases, stress may become a significant issue. In an embodiment, the barrier layer 424 has a thickness in a range from 2 nm to 15 nm. In another embodiment, the thickness of the barrier layer 424 may be thicker. For example, for process integration purposes, and the barrier layer 424 can include only an oxide film or a combination of an oxide film, a nitride film, and another oxide film (ONO). Electrical characteristics of the electronic device may require the barrier layer 424 to be thicker than 15 nm; however, the thickness should not be greater than reasonably needed.

The semiconductor layer 426 can include any of the materials previously described with respect to the semiconductor layer 222. The semiconductor layer 426 can have the same or a different composition as compared to the semiconductor layer 222, and the semiconductor layer 426 can have the same or a different base semiconductor material as compared to the semiconductor layer 222. The semiconductor layer 426 can be formed using any of the methods as previously described with respect to the semiconductor layer 222 with the exception that the semiconductor layer 426 may not be formed by an epitaxial growth. The remaining portion of the trench 160 is substantially filed by the semiconductor layer 426.

During formation of the semiconductor layer 426, the semiconductor layer 426 forms along exposed surfaces of the workpiece. As the semiconductor layer 426 becomes thicker, the seam 440 or one or more voids 442 may form along the vertical centerline 460 of the trench 160 as portions of the semiconductor layer 426 along different sides of the trench 160 contact each other.

The workpiece can be exposed to radiation, such as during a thermal operation. The thermal operation may be performed to reduce stress, diffuse a dopant, form a layer, or for another reason. The thermal operation may be performed after forming the semiconductor layer 426 and before performing any further processing operations or may be performed at a subsequent time in the fabrication process. In another embodiment, the thermal operation may represent all significant thermal operations (e.g., operations performed at a temperature of at least 600° C.) that are performed during the remaining steps in the fabrication process. While the discussion below addresses the thermal operation as a single operation, after reading this specification, skilled artisans will appreciate that the discussion extends to more than one subsequent thermal operation.

The thermal operation may be performed at a temperature of at least 600° C. Many semiconductor operations are performed at a temperature of 800° C., 900° C., and higher. The viscous flow point of $SiO_2$ is in a range from 950° C. to 975° C., and thus, the thermal operation may be performed at a temperature of 975° C. or higher to anneal stress or densify a layer including a silicon oxide. The thermal operation can be in a range of 900° C. to 1200° C. The temperature of the thermal operation will be less than the melting or sublimation point of the semiconductor layer 426.

The time period of the thermal operation may be determined by the results that are to be achieved by the thermal operation, such as reducing stress, formation of a layer, diffusing a dopant, densification or flowing of an oxide, or the like. The time period may be for a time period of at least 5 minutes. The thermal operations listed earlier in this paragraph may be performed for a time period of at least 10 minutes, and many will be for at least 20 minutes. The thermal operation will usually be performed for a time period of at most 6 hours. For most applications, the time period will be in a range of 10 to 60 minutes.

A combination of the temperature and the time period of the thermal operation can result in one or more voids 542 at an interface between the semiconductor layer 426 and the barrier layer 424, as illustrated in FIG. 5. Although all voids 542 as illustrated in FIG. 5 are at the interface between the semiconductor layer 426 and the barrier layer 424, not all voids 542 may be at the interface. In an embodiment, one or more of the voids 542 may have been generated from trapped gas along the seam 440. In the same or a different embodiment, one or more of the voids 542 can be a void 442 (FIG. 4) that has migrated from the vertical centerline 460 of the trench 160 but has not yet reached the barrier layer 424. In either of the two prior embodiments or in a different embodiment, one or more of the voids 442 may change shape, a larger void may become a plurality of smaller voids, or a plurality of voids may coalesce into a larger void. The formation and migration corresponding to the voids 542 is due at least in part to self-diffusion of the base semiconductor material within the semiconductor layer 426. For example, a particular silicon atom in a polysilicon layer can diffuse from a location closer to the barrier layer 424 to a location closer to the vertical centerline 460 of the trench 160. As illustrated in FIG. 5, portions 426a and 426b of the semiconductor layer 426 contact each other at a location closer to the vertical centerline 460 of the trench 160 as compared to the barrier layer 424. A portion 426c of the semiconductor layer 426 is disposed between one of the voids 542 and the vertical centerline 460 of the semiconductor layer 426. Although not completely analogous, the migration of the voids may be pictured in a manner similar to bubbles (trapped gas) passing through water. The water molecules are moving which allow the bubbles to move toward the surface of the water.

The barrier layer 424 helps to keep the voids from reaching the semiconductor layer 222, and thus, the voids 542 do not migrate into the semiconductor layer 222. Thus, the voids 542 do not reach the surface of the semiconductor layer 222 closer to the sidewall 162 of the trench 160, as opposed to the surface of the semiconductor layer 222 closer to the barrier layer 424. Thus, even for combinations of a relatively high temperature (at least 1000° C.) and a relatively longer time period (at least 30 minutes), the voids 542 remain contained within the semiconductor layer 426.

Referring to FIG. 6, the portion of the semiconductor layer 426 outside of the trench 160 can be removed or patterned, similar to the operation that may be performed as described with respect to the semiconductor layer 222. A planarization operation, such as CMP or an etchback process, can be performed to remove the semiconductor layer 426 overlying the primary surface 122 of the substrate 120. In another embodiment, a masking layer may be formed over the primary surface 122, and exposed portions of the semiconductor layer 426 may be removed to form a patterned layer. The patterned layer may include one or more components of an electronic device, such as a gate electrode, a resistor, a capacitor electrode, an anode or a cathode of a diode, or the like.

FIG. 7 includes a cross-sectional view of a substantially completed electronic device. In an embodiment, an inter-level dielectric (ILD) layer 700 can be formed over the workpiece 100. The ILD layer 700 can include an oxide, a nitride, an oxynitride, or any combination thereof. The ILD layer 700 can be deposited to a thickness in a range from approximately 0.5 micron to approximately 2.0 microns. Portions of the ILD layer 700 are patterned to define contact openings, such as contact opening 720. A conductive layer can be formed within the contact openings and over the ILD layer 700 and patterned to form interconnects that extend into the contact openings, such as the interconnect 740 that extends into the contact opening 720. In the embodiment as illustrated in FIG. 7, the interconnect 740 contacts the semiconductor layers 222 and 426. In another embodiment, an interconnect may contact one, rather than both, of the semiconductor layers 222 and 426. One or more interconnect levels and a passivation layer (not illustrated in FIG. 7) may be formed over the workpiece 100. Each interconnect level can include an ILD layer and interconnects. The passivation layer can be formed over the uppermost interconnect level and patterned to expose bond pads. A polyimide or other protective layer may be formed over the passivation if needed or desired for a particular application.

The process described above is well suited for other shapes of trenches. FIG. 8 includes an illustration of a workpiece 800 that includes a trench 860 formed using the Bosch process. The Bosch process can include (1) etching the substrate to define a portion of the trench including a portion of the sidewall of the trench; (2) forming a passivation layer along the portion of the sidewall of the trench; and iterating actions (1) and (2) until a desired depth of the trench is achieved. The trench 860 has a sidewall 862 and a bottom 864 and extends from the primary surface 122 into the substrate 120. The sidewall 862 has a surface where the width of the trench 860 varies with the depth of the trench 860. A sidewall smoothing process may not be performed or may not completely smooth the sidewall of the trench 860.

Figure 9:
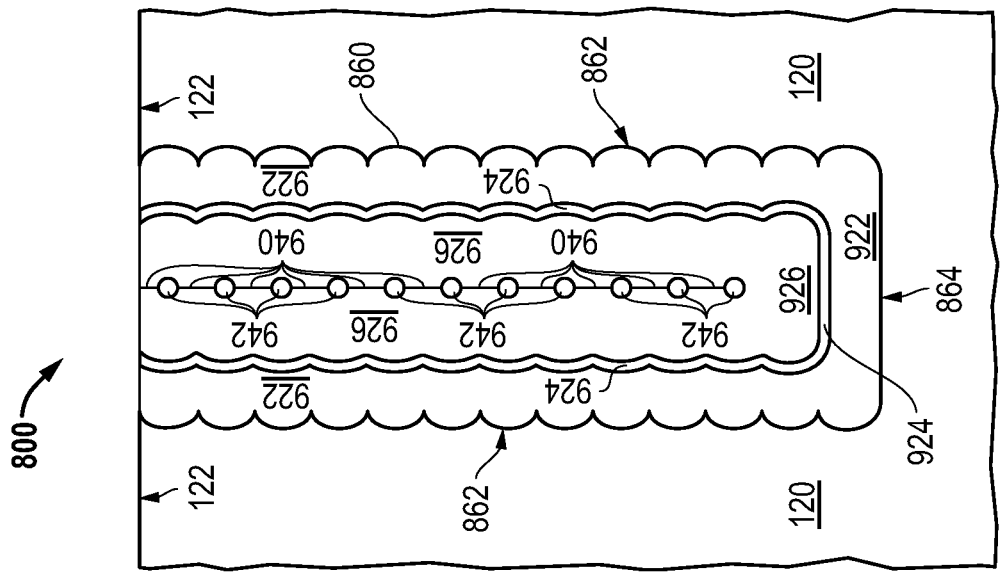
FIG. 9 includes an illustration of a cross-sectional view of the workpiece of FIG. 8 after forming a semiconductor layer, a barrier layer, and another semiconductor layer.

In FIG. 9, a semiconductor layer 922, a barrier layer 924, and a semiconductor layer 926 are formed within the trench 860 using a process as previously described with respect to the semiconductor layer 222, the barrier layer 424, and the semiconductor layer 426. In addition to a seam 940, cavities 942 are formed at one or more locations where the width of the trench is wider as compared to a location at an elevation adjacent to the primary surface 122. In FIG. 10, a thermal operation is performed, and the cavities 942 can become voids 1042 that migrate within the semiconductor layer 926, and some of the voids 1042 migrate to the barrier layer 924. Similar to the prior embodiment, the barrier layer 924 helps to keep the voids 1042 contained within the semiconductor layer 926 and not reach the semiconductor layer 922.

Figure 13:
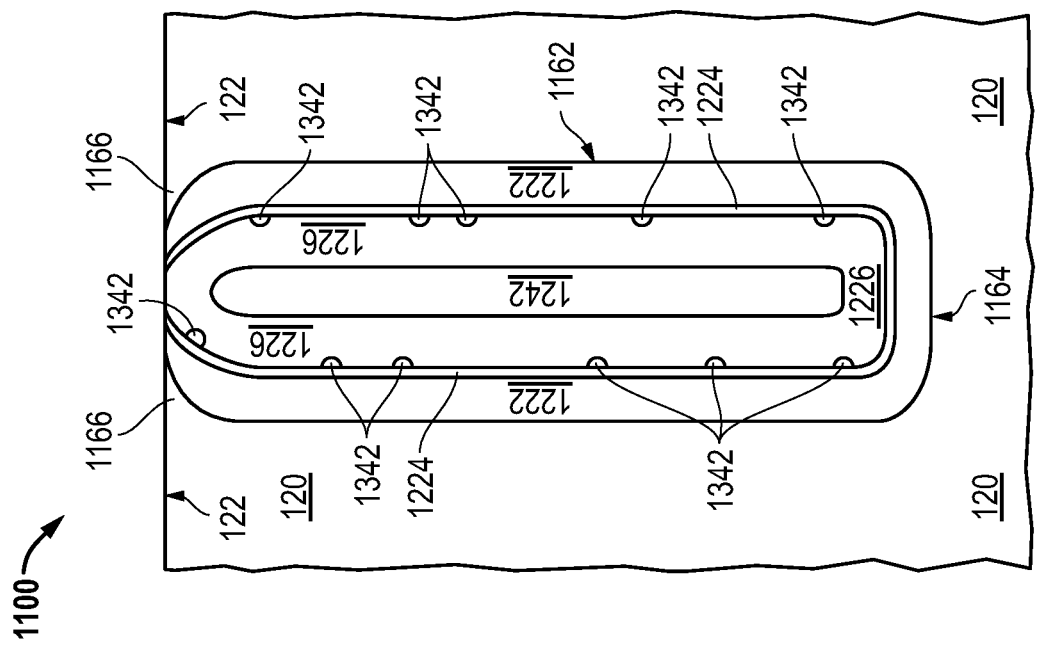
FIG. 13 includes an illustration of a cross-sectional view of the workpiece of FIG. 12 after performing a thermal operation that forms voids along the barrier layer.

The process can be used with a trench having a reentrant angle. FIG. 11 includes an illustration of a workpiece 1100 that includes a trench 1160 having a sidewall 1162 and a bottom 1164. When patterning the substrate 120 to define the trench 1160, the width of the trench 1160 along or near the primary surface 122 is narrower that the width of the trench 1160 along the remainder of the sidewall 1162 with the possible exception of the transition between the sidewall 1162 and the bottom 1164 of the trench 1160. Portion 1166 of the substrate 120 corresponds to the reentrant angle. In FIG. 12, a semiconductor layer 1222, a barrier layer 1224, and a semiconductor layer 1226 are formed within the trench 1160 using a process as previously described with respect to the semiconductor layer 222, the barrier layer 424, and the semiconductor layer 426. In addition to a seam 1240, a cavity 1242 is formed where the width of the trench 1260 is wider as compared to a location at an elevation at or near the primary surface 122. In FIG. 13, a thermal operation is performed, and voids 1342 are formed and migrate within the semiconductor layer 1226, and some of the voids 1342 migrate to the barrier layer 1224. The seam 1240 may or may not disappear. Similar to the prior embodiment, the barrier layer 1224 helps to keep the voids 1342 contained within the semiconductor layer 1226 and not reach the semiconductor layer 1222.

In other embodiment, a trench within a substrate can have another geometry. The processes described herein can prevent or substantially reduce the likelihood that voids will form and migrate into the semiconductor layer closest to the sidewall of the trench. The process can be used with many different trench geometries and is not limited to the geometries illustrated in the figures and described in this specification.

Figure 14:
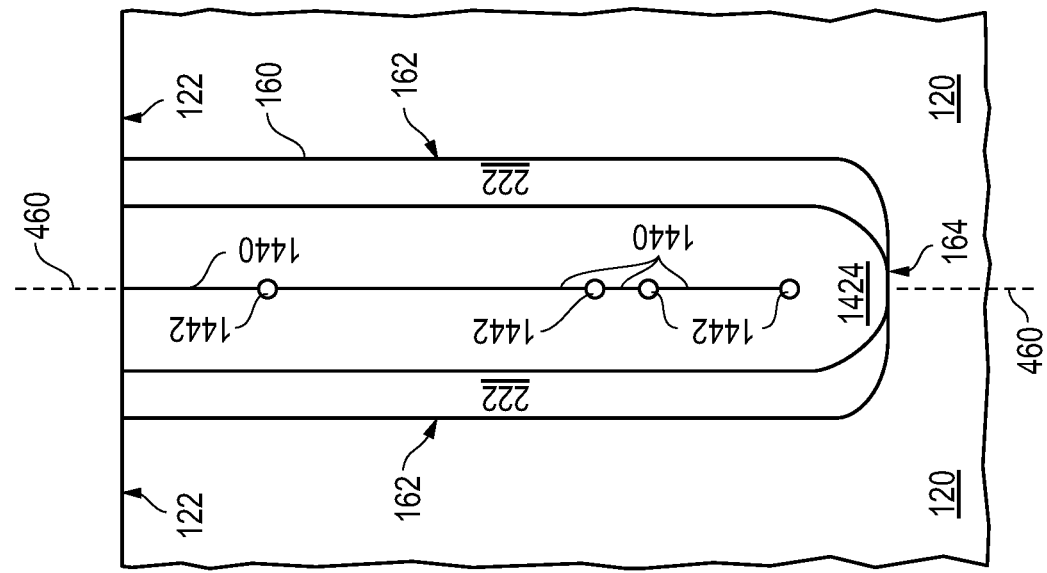
FIG. 14 includes an illustration of a cross-sectional view of a portion of a workpiece that includes a substrate after patterning the substrate to define a trench extending into the substrate and forming a semiconductor layer and an insulating layer within the trench.

In a further embodiment, a plurality of semiconductor layers is not required. An exemplary process can start with the process as described with respect to FIGS. 1 to 3, where the substrate 120 has been patterned to include the trench 160, and the semiconductor layer 222 is formed that partly, and not completely, fills the trench 160. Continuing with the process, an insulating layer 1424 can be formed that substantially fills a remaining portion of the trench 160, as illustrated in FIG. 14. The insulating layer 1424 can include any of the materials and be formed using any of the process as previously described with respect to the barrier layer 424. The insulating layer 1424 can be substantially thicker than the barrier layer 424. A scam 1440 or one or more voids 1442 may form along or near the vertical centerline 460 of the trench 160. Unlike embodiments where the trench is filled or sealed using a semiconductor material, the trapped gas within the seam 1440 and the one or more voids 1442 do not migrate to the semiconductor layer 222, and thus, voids are substantially prevented from forming between the semiconductor layer 222 and the sidewall 162 of the trench 160.

The concepts as described herein can be used and adapted to particular process integration schemes. A couple of process integration schemes are described and illustrated to give skilled artisans a better understanding of how the teachings herein can be implemented. The exemplary process integration schemes are intended to illustrate and not limit how the teachings previously described may be implemented.

Figure 15:
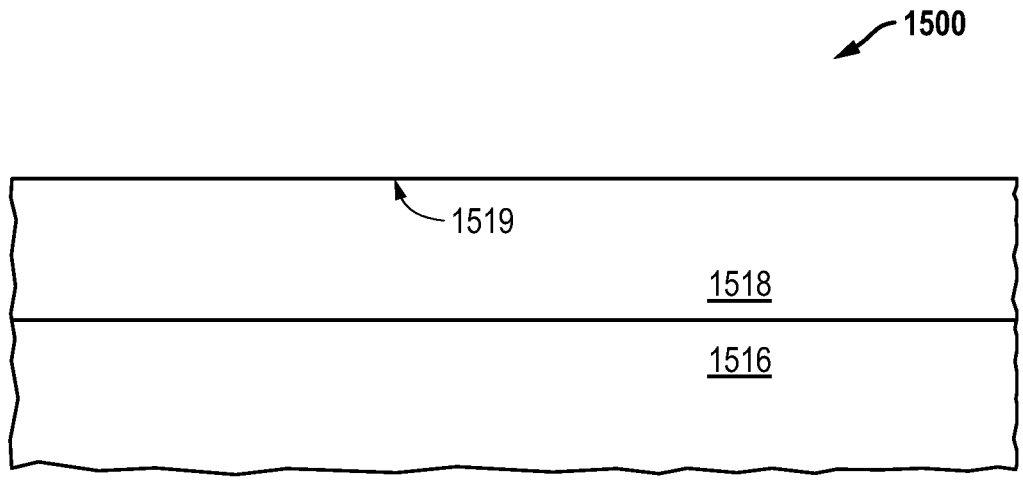
FIG. 15 includes an illustration of a cross-sectional view of a portion of a workpiece that includes a substrate that includes a buried conductive region and a semiconductor layer overlying the buried conductive region.

The trench and semiconductor layers previously described can be used in forming a power transistor. FIG. 15 includes an illustration of a cross-sectional view of a portion of a workpiece 1500 that includes a buried conductive region 1516, and a semiconductor layer 1518 having a primary surface 1519. The buried conductive region 1516 can include a Group 14 element (i.e., carbon, silicon, germanium, or any combination thereof) and can be heavily n-type or p-type doped. For the purposes of this specification, heavily doped is intended to mean a peak dopant concentration of at least approximately $1 \times 10^{19}$ atoms/cm$^3$, and lightly doped is intended to mean a peak dopant concentration of less than approximately $1 \times 10^{19}$ atoms/cm$^3$. The buried conductive region 1516 can be a portion of a heavily doped substrate (e.g., a heavily n-type doped wafer) or a buried doped layer overlying a wafer having a conductivity type opposite that of the buried doped layer. In an embodiment, the buried conductive region 1516 is heavily doped with a n-type dopant, such as arsenic, phosphorus, or antimony.

The semiconductor layer 1518 is disposed over the buried conductive region 1516 and has a primary surface 1519. The semiconductor layer 1518 can include a Group 14 element and has an opposite conductive type as compared to the buried conductive region 1516. In an embodiment, the semiconductor layer 1518 is a lightly doped p-type epitaxial silicon layer having a thickness in a range from approximately 0.5 micron to approximately 9 microns, and a dopant concentration in a range from $1 \times 10^{14}$ atoms/cm$^3$ to $1 \times 10^{17}$ atoms/cm$^3$. The semiconductor layer 1518 may be disposed over all of the workpiece 1500. The dopant concentration within the semiconductor layer 1518 as formed or before selectively doping regions within the semiconductor layer 1518 will be referred to as the background dopant concentration.

The substrate is patterned to define a trench 1660. In the illustrated embodiment, the substrate can include the buried conductive region 1516 and the semiconductor layer 1518. The trench 1660 extends from the primary surface 1519 and through the semiconductor layer 1518 and into, but not completely through, the buried conductive region 1516. In another embodiment, the trench 1660 may terminate at the buried conductive region 1516 (the bottom of the trench 1660 is substantially coterminous with the upper boundary of buried conductive region 1516). In a further embodiment, the bottom of the trench 1660 may be at an elevation that is most 0.9 micron above the buried conductive region 1516.

A semiconductor layer 1622, a barrier layer 1624, and a semiconductor layer 1626 are formed within the trench 1660 using any of the materials and processes as previously described with respect to the semiconductor layer 222, the barrier layer 424, and the semiconductor layer 426. When the semiconductor layer 1626 is formed, a scam and one or more voids (not illustrated in FIG. 16) lie along a vertical centerline of the trench. In an embodiment, the semiconductor layer 1622 can be a dopant source. A thermal operation can include a dopant drive to diffuse dopant from the semiconductor layer 1622 to form the doped regions 1606. During the thermal operation, one or more voids 1642 can migrate to the barrier layer 1624 but do not migrate into the semiconductor layer 1622. If any of the voids 1642 would have migrated to the semiconductor layer 1622 at or near the sidewall of the trench 1660, the dopant concentration of the doped region 1606 may be locally lower adjacent to the void, and thus, the dopant concentration of the doped region 1606 along the interface with the semiconductor layer 1622 would be less uniform.

Figure 16:
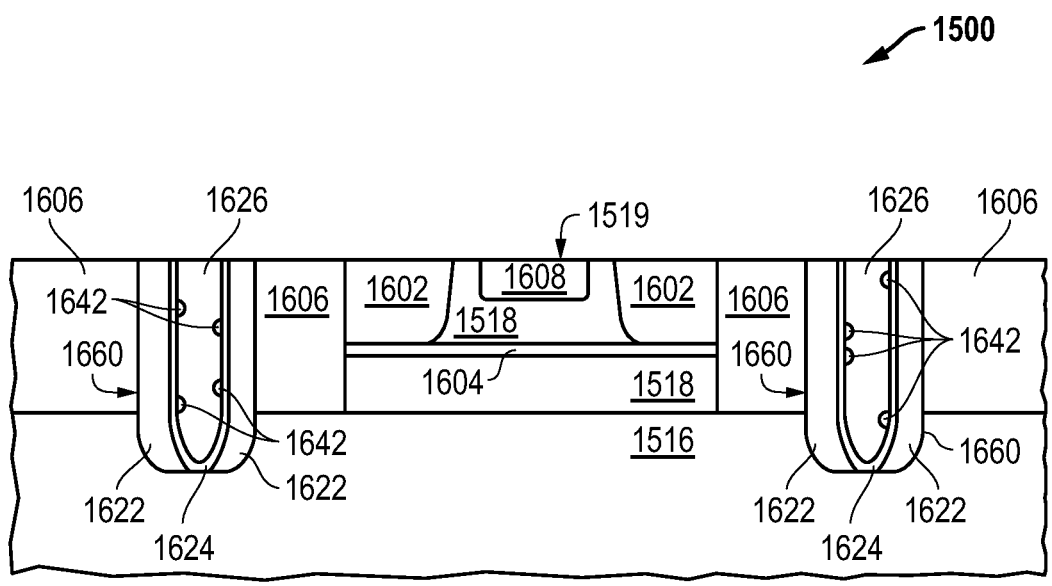
FIG. 16 includes an illustration of a cross-sectional view of the workpiece of FIG. 15 after patterning the substrate to define a trench, forming a structure within the trench, and doped regions within the semiconductor layer.
Figure 17:
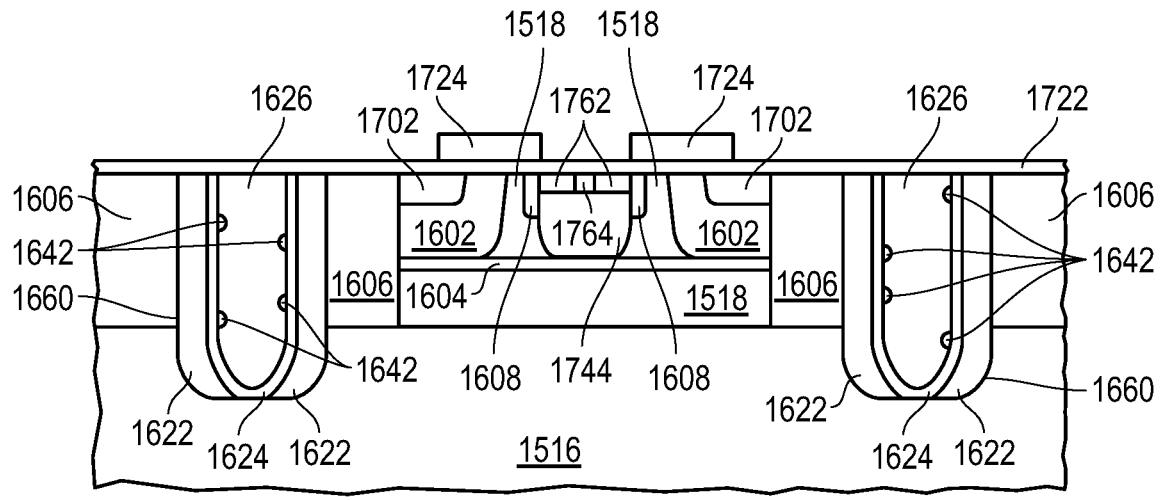
FIG. 17 includes an illustration of a cross-sectional view of the workpiece of FIG. 16 after forming further doped regions within the semiconductor layer, a gate dielectric layer, and a gate electrode.

Many other doped regions and features can be subsequently formed as illustrated in FIGS. 16 and 17. The order in which the doped regions and other features are described are not necessarily the order in which they are formed. After reading this specification in its entirety, skilled artisans will be able to determine an order regarding formation of the doped regions that meets the desires or needs for a particular application.

FIG. 16 further illustrates the workpiece 1500 after forming a drift region 1602, a resurf region 1604, and a well region 1608. The drift region 1602 has the same conductivity type as the buried conductive region 1516, and the resurf region 1604 has a conductivity type opposite that of the regions 1602, 1606, and 1516. In the embodiment as illustrated, the transistor structure being formed has an annular structure for the active region. Therefore, FIG. 16 illustrates different portions of the drift region 1602 and different portions of the doped region 1606.

The drift region 1602 is formed within the semiconductor layer 1518 and extends from the primary surface 1519 of the semiconductor layer 1518 towards the buried conductive region 1516. In an embodiment, the drift region 1602 may have a depth that is in a range from 5% to 75% of the thickness of the semiconductor layer 1518. In terms of values, the drift region 1602 can have a depth in a range from 0.5 micron to 5 microns. The drift region 1602 can have a light to moderate dopant concentration. In an embodiment, the drift region 1602 has a dopant concentration in a range from $1\times10^{15}$ atoms/cm$^3$ to $5\times10^{17}$ atoms/cm$^3$. In a particular embodiment, the drift region 1602 is n-type doped.

The resurf region 1604 is formed within the semiconductor layer 1518 and spaced apart from the primary surface 1519. In a lateral direction, the resurf region 1604 may or may not extend completely to the drift region 1602, and in a vertical direction, an elevation of a peak dopant concentration of the resurf region 1604 is at or below the lowest elevation of the drift region 1602. In the embodiment as illustrated, the resurf region 1604 abuts the drift region 1602 and has a peak concentration at an elevation that is within 0.6 micron of the lowest elevation of the drift region 1602. In an embodiment, the resurf region 1604 has a dopant concentration in a range from $1\times10^{15}$ atoms/cm$^3$ to $5\times10^{17}$ atoms/cm$^3$. In a particular embodiment, the resurf region 1604 is p-type doped.

The well region 1608 is formed within the semiconductor layer and extends from the primary surface 1519 of the semiconductor layer 1518 towards the buried conductive region 1516. In an embodiment, the well region 1608 is spaced apart from the resurf region 1604. In a particular embodiment, the well region 1608 can have a depth in a range from 0.2 micron to 4 microns. The well region 1608 can have a dopant type opposite that of the drift region 1602 and a light to moderate dopant concentration. In an embodiment, the well region 1608 has a dopant concentration in a range from $1\times10^{15}$ atoms/cm$^3$ to $1\times10^{17}$ atoms/cm$^3$. In a particular embodiment, the well region 1608 is p-type doped.

FIG. 17 includes an illustration after forming remaining parts of a transistor structure. A shallow trench isolation structure 1702 extends from the primary surface 1519 to a depth in a range from 0.2 micron to 0.9 micron. In a lateral direction, the shallow trench isolation structure 1702 extends from the doped region 1606 into the drift region 1602. A portion of the drift region 1602 is disposed between the shallow trench isolation structure 1702 and the channel region for the transistor structure being formed. The shallow trench isolation structure 1702 includes one or more films of oxide, nitride or oxynitride.

A gate dielectric layer 1722 can include one or more films of oxide, nitride, or oxynitride. The gate dielectric layer 1722 has a thickness in a range from 2 nm to 15 nm for many applications. The gate dielectric layer 1722 can be formed by thermal growth or deposition. A gate electrode 1724 is formed by depositing a conductive layer and patterning the conductive layer to achieve the pattern as illustrated in FIG. 17. The gate electrode 1724 can have a thickness in a range from 50 nm to 500 nm. In the embodiment as illustrated, the gate electrode 1724 overlies part of the shallow trench isolation structure 1702 to allow for depletion of charge carriers within the drift region 1602 under the shallow trench isolation structure 1702.

A resurf extension region 1744 is formed within the semiconductor layer 1518. The resurf extension region 1744 allows a connection to be made between the resurf region 1604 and a subsequently-formed surface contact. The resurf extension region 1744 extends from the primary surface 1519 of the semiconductor layer 1518 towards the buried conductive region 1516 and extends to the resurf region 1604. In a particular embodiment, the resurf extension region 1744 can have a depth in a range from 0.2 micron to 5 microns. The resurf extension region 1744 can have a dopant type that is the same as the resurf region 1604 and a light to moderate dopant concentration. In a particular embodiment, the resurf extension region 1744 has a dopant concentration that is between the dopant concentration of the resurf region 1604 and the well region 1608. In an embodiment, the resurf extension region 1744 has a dopant concentration in a range from $1\times10^{15}$ atoms/cm$^3$ to $1\times10^{18}$ atoms/cm$^3$. In a particular embodiment, the resurf extension region 1744 is p-type doped.

A source region 1762 is formed and allows ohmic contacts to be made to subsequently-formed conductive plugs or interconnects. The source region 1762 is relatively shallow and lies along the primary surface 1519 of the semiconductor layer 1518. In a particular embodiment, the source region 1762 can have a depth in a range from 0.05 micron to 0.5 micron. The source region 1762 can have a dopant type that is the same as the doped region 1606. In an embodiment, the source region 1762 has a dopant concentration in a range from at least $1\times10^{19}$ atoms/cm$^3$. In a particular embodiment, the source region 1762 is n-type doped.

A body contact region 1764 allows an ohmic contact to be made to subsequently-formed conductive plugs or interconnects. The body contact region 1764 is relatively shallow and lies along the primary surface 1519 of the semiconductor layer 1518. In a particular embodiment, the body contact region 1764 can have a depth in a range from 0.05 micron to 0.5 micron. The body contact region 1764 can have a dopant type that is the same as the well region 1608. In an embodiment, the body contact region 1764 has a dopant concentration of at least $1\times10^{19}$ atoms/cm$^3$. In a particular embodiment, the body contact region 1764 is p-type doped.

Figure 18:
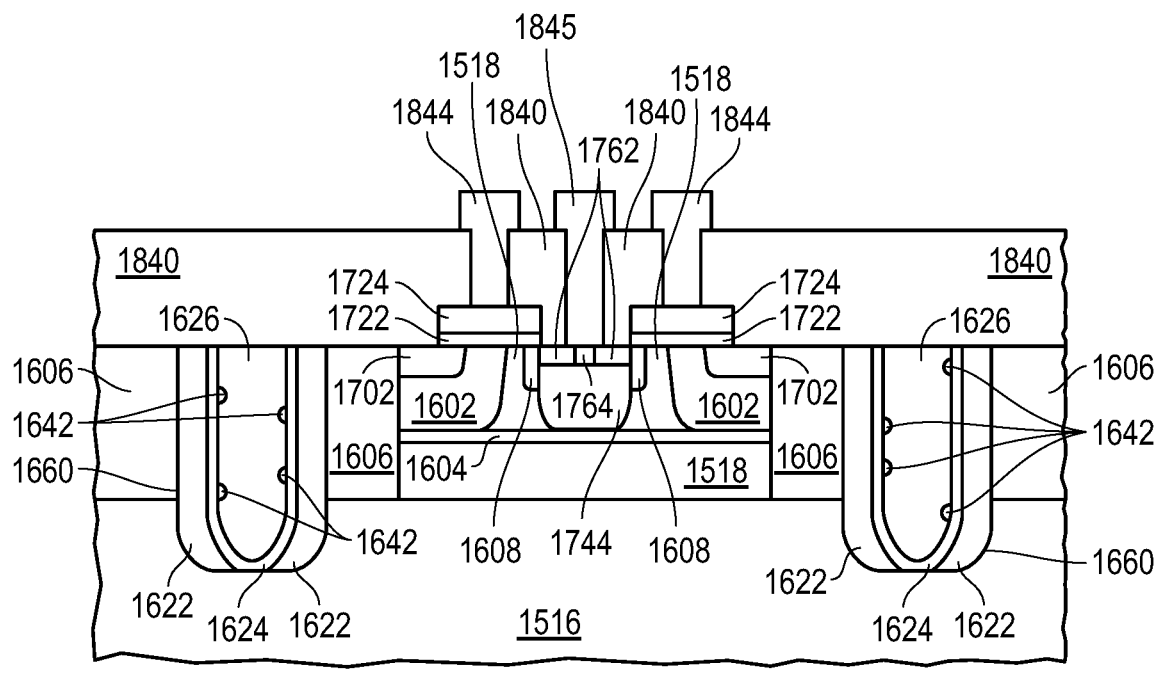
FIG. 18 includes an illustration of a cross-sectional view of the workpiece of FIG. 17 after forming a substantially completed electronic device that includes a power transistor.

FIG. 18 includes an illustration of the workpiece after forming an ILD layer 1840 and interconnects 1844 and 1845. The ILD layer 1840 is formed over the workpiece and can include an oxide, a nitride, an oxynitride, an organic dielectric, or any combination thereof. The ILD layer 1840 can include a single film having a substantially constant or changing composition (e.g., a high phosphorus content further from the semiconductor layer 1518) or a plurality of discrete films. An etch-stop film, an antireflective film, or a combination may be used within or over the ILD layer 1840 to help with processing. The ILD layer 1840 can be deposited to a thickness in a range from approximately 0.5 micron to approximately 2.0 microns. In the embodiment, the ILD layer 1840 may or may not be planarized. The ILD layer 1840 is patterned to define the openings in which the interconnects 1844 and 1845 are subsequently formed.

Interconnects 1844 and 1845 are formed within the openings in the ILD layer 1840. As illustrated, the interconnects 1844 are electrically connected to the gate electrode 1724, and the interconnect 1845 is electrically connected to the source region 1762 and the body contact region 1764. Other interconnects are formed that make electrical contact at other locations for the transistor structure illustrated. When the buried conductive region 1516 is in the form of a wafer, the buried conductive region 1516 is the heavily doped drain for the transistor. Although the interconnects 1844 and 1845 are illustrated as being side-by-side to simplify understanding of the transistor structure, the interconnects may be offset in a lateral direction to allow for a smaller area of the transistor structure, to reduce capacitive coupling between the interconnects, or the like.

One or more interconnect levels and a passivation layer may be formed over the workpiece 100. Each interconnect level can include an interlevel dielectric layer and interconnects. The passivation layer can be formed over the uppermost interconnect level and patterned to expose bond pads. A polyimide or other protective layer may be formed over the passivation if needed or desired for a particular application. The interconnects 1844 and 1845 can be coupled to a gate terminal and a source terminal along a topside of a die. In an embodiment, the workpiece can be background, and backside metal (not illustrated) can be a drain terminal and contact the buried conductive region 1516.

Figure 19:
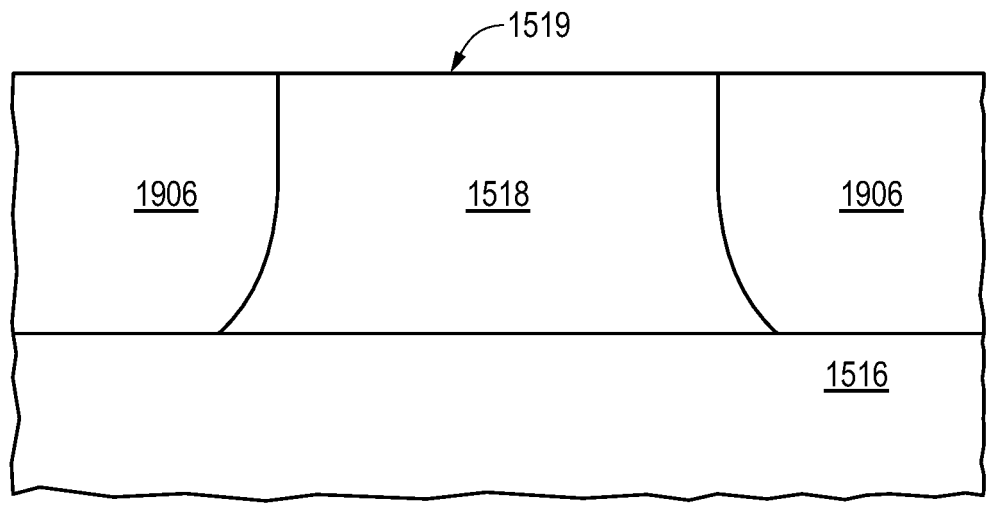
FIG. 19 includes an illustration of a cross-sectional view of a portion of a workpiece that includes a substrate that includes a buried conductive region and a semiconductor layer doped region, both overlying the buried conductive region.

In another process integration scheme, a capacitor within a trench and a nonvolatile memory (NVM) cell can be formed. In FIG. 19, a sinker region 1906 is formed within the semiconductor layer 1518 and extends from the primary surface 1519 of the semiconductor layer 1518 towards the buried conductive region 1516. In the embodiment as illustrated, the sinker region 1906 extends to the buried conductive region 1516. The sinker region 1906 can be moderately to heavily doped. In an embodiment, the sinker region 1906 has a dopant concentration in the range of $5\times10^{17}$ atoms/cm$^3$ to $1\times10^{20}$ atoms/cm$^3$. The dopant concentration may be higher or lower depending on needs or desires for a particular application.

Figure 20:
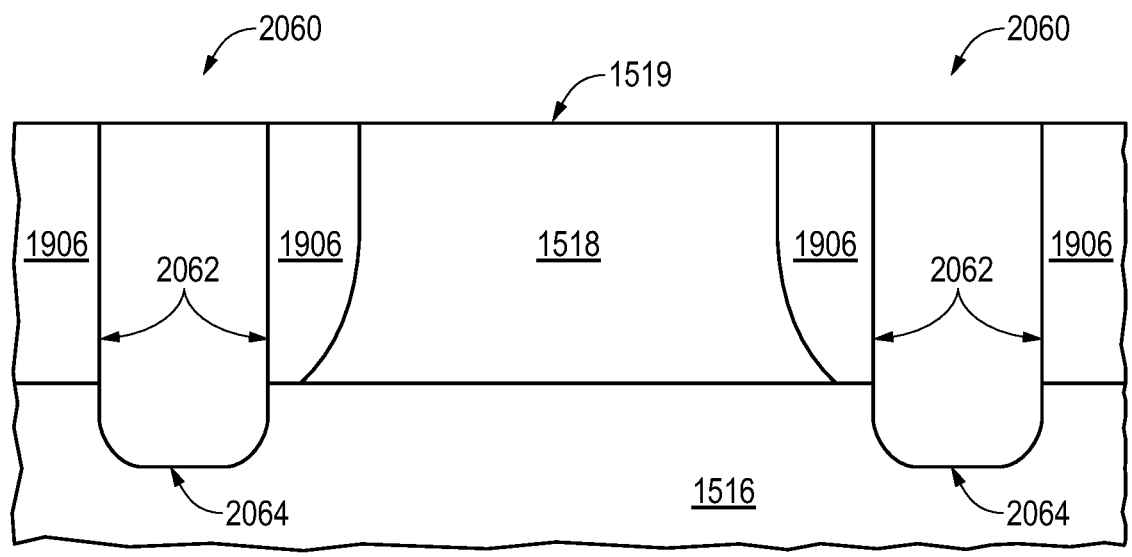
FIG. 20 includes an illustration of a cross-sectional view of the workpiece of FIG. 19 after patterning the substrate to define a trench extending into the substrate.

In FIG. 20, the substrate is patterned to define the trench 2060 that has a sidewall 2062 and a bottom 2064. In the embodiment illustrated, the substrate can include the buried conductive region 1516, the semiconductor layer 1518, and the sinker region 1906. The trench 2060 may extend from the primary surface 1519 and through the sinker region 1906 and into, but not completely through, the buried conductive region 1516. In another embodiment, the trench 2060 may terminate at the buried conductive region 1516 (the bottom 2064 of the trench 2060 substantially coterminous with the buried conductive region 1516). In a further embodiment, the bottom 2064 of the trench 2060 may be at an elevation that is most 0.9 micron above the buried conductive region 1516.

Although not illustrated, in another embodiment, the sinker region 1906 may be formed after the trench 2060 is defined. In this embodiment, the semiconductor layer 1518, rather than the sinker region 1906, can be etched to define the trench 2060. The design considerations (for example, where the bottom 2064 of the trench 2060 is with respect to the buried conductive region 1516) are substantially the same whether the sinker region 1906 is formed before or after the trench 2060 is defined.

Figure 21:
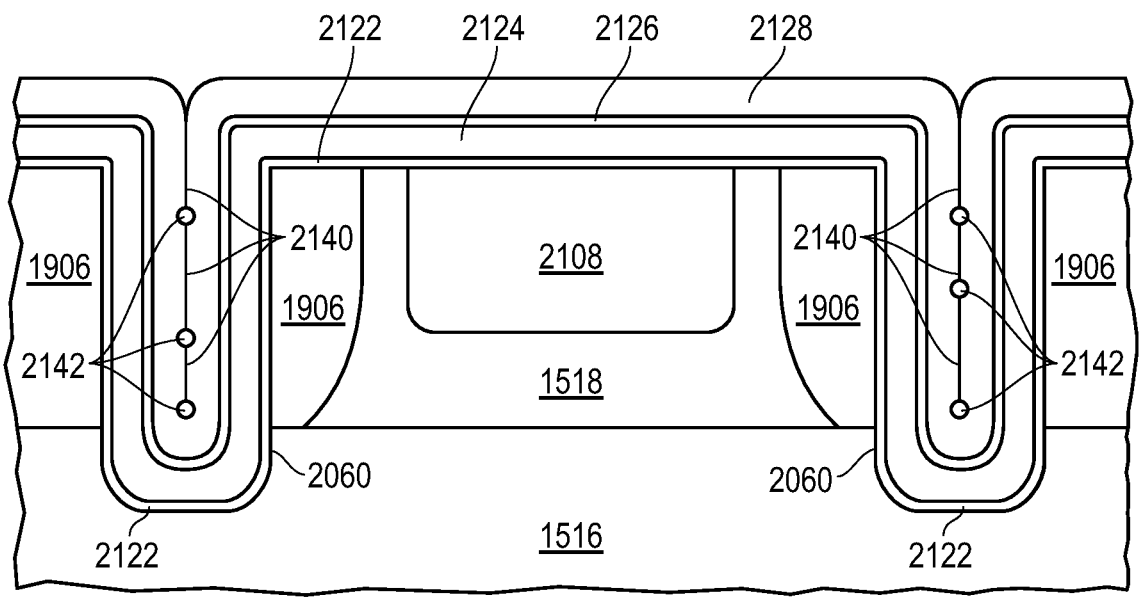
FIG. 21 includes an illustration of a cross-sectional view of the workpiece of FIG. 20 after forming a well region, a tunnel dielectric layer, a floating gate layer, an inter-gate dielectric layer, and a control gate layer.

Referring to FIG. 21, a well region 2108 is formed in a portion of the semiconductor layer 1518. The active portion of the NVM cell is formed within the well region 2108. The well region 2108 has a conductivity type that is opposite the sinker region 1906. In an embodiment, the well region 2108 can be p-type doped and have a dopant concentration in a range of $1\times10^{15}$ atoms/cm$^3$ to $5\times10^{17}$ atoms/cm$^3$.

A tunnel dielectric layer 2122, a floating gate layer 2124, an inter-gate dielectric layer 2126, and a control gate layer 2128 are sequentially formed to provide the structure as illustrated in FIG. 21. The tunnel dielectric layer 2122 can include an oxide or an oxynitride and have a thickness in a range from 5 nm to 15 nm. The floating gate layer 2124 and the control gate layer 2128 can have any of the compositions previously described with respect to the semiconductor layers 222 and 426, respectively. Other than selective epitaxy, the floating gate layer 2124 and the control gate layer 2128 can be formed using any of the processing techniques previously described with respect to the semiconductor layers 222 and 426, respectively. The floating gate layer 2124 and the control gate layer 2128 can have substantially the same composition or significantly different compositions. In an embodiment, the floating gate layer 2124 and control gate layer 2128 can have the same base semiconductor material, such as Si. Each of the floating gate and control gate layers 2124 and 2128 can be conductive and, in an embodiment, have a dopant concentration in a range from $1\times10^{18}$ atoms/cm$^3$ to $1\times10^{21}$ atoms/cm$^3$.

The inter-gate dielectric layer 2126 can include an oxide film, a nitride film, and another oxide film (ONO) and have a thickness in a range from 11 nm to 40 nm. Similar to the barrier layer 424, in this embodiment, the inter-gate dielectric layer 2126 can act as a barrier layer within the trench 2060. When the control gate layer 2128 is formed, a scam 2140 and voids 2142 may be formed where portions of the control gate layer 2128 contacts itself at or near a vertical centerline of the trench 2060.

Figure 22:
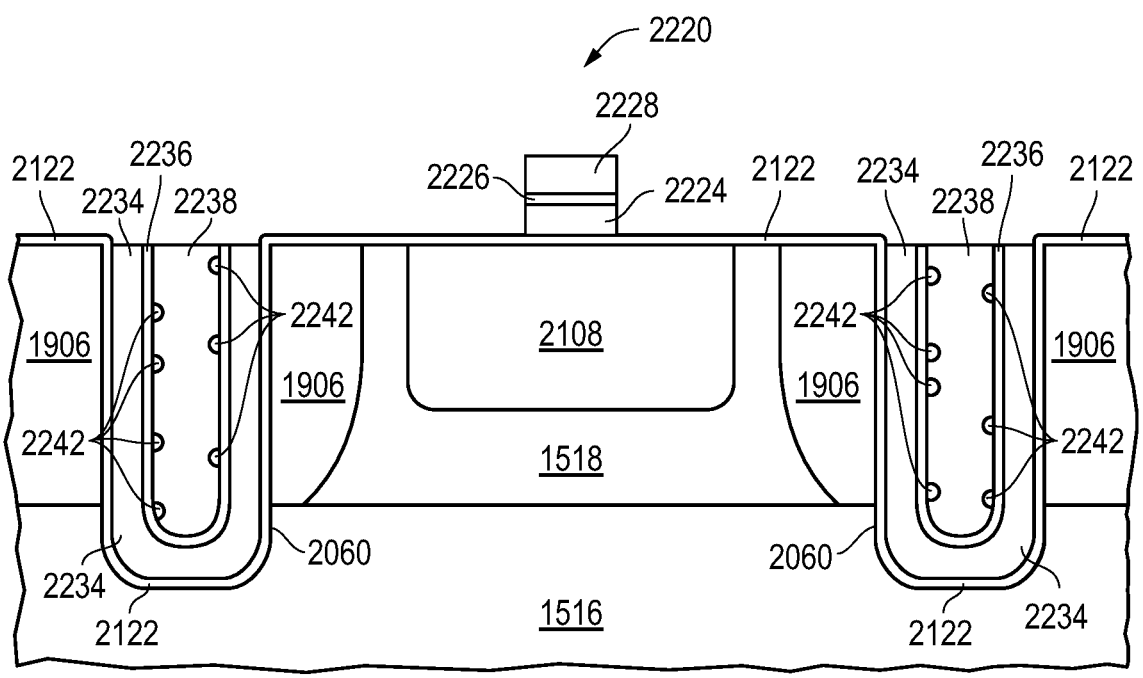
FIG. 22 includes an illustration of a cross-sectional view of the workpiece of FIG. 21 after patterning the layers to form a gate stack and a structure within the trench.

Referring to FIGS. 21 and 22, the layers 2124, 2126 and 2128 are patterned to define a gate stack 2220 and to remove other portions of the layers 2124, 2126, and 2128 that are outside the trench 2060. The gate stack 2220 includes a floating gate electrode 2224, a control gate electrode 2228, a portion the tunnel dielectric layer 2122 disposed between the floating gate electrode 2224 and the semiconductor layer 1518, and a portion 2226 of the inter-gate dielectric layer 2126 disposed between the floating and control gate electrodes 2224 and 2228. Within the trench 2060, a member 2234 is a portion of the floating gate layer 2124 that is within the trench 2060, a member 2238 is a portion of the control gate layer 2128 that is within the trench 2060, and a member 2236 is a portion of the inter-gate dielectric layer 2126 that is within the trench 2060 and disposed between the members 2234 and 2238.

The workpiece is exposed to one or more thermal operations where one or move voids migrate or become generated from the seam 2140 or voids 2142 within the control gate layer 2128 with the trench or the member 2238 and migrate toward the inter-gate dielectric layer 2126 within the layer or the member 2236. Thus, the previous description regarding the thermal operation with respect to the voids 542 also applies to thermal operations of the layers with the trench 2060.

The thermal operation is performed at a time after the control gate layer 2128 is formed and before the finished electronic device is formed. The thermal operation may be any one or more of the previously described thermal operations with respect to the voids 542 as illustrated in FIG. 5. With respect to the NVM cell, the thermal operation may be performed to reduce stress or activate or diffusion a dopant in a subsequently-formed doped region. One or more voids 2242 are formed as illustrated in FIG. 22. Part of the seam 2140 or one or more of the voids 2142 may be present but are not illustrated in FIG. 22. The member 2236 (a portion of the inter-gate dielectric) keeps the voids away from the member 2234 (a portion of the floating gate layer), which is an electrode for the capacitor.

Figure 23:
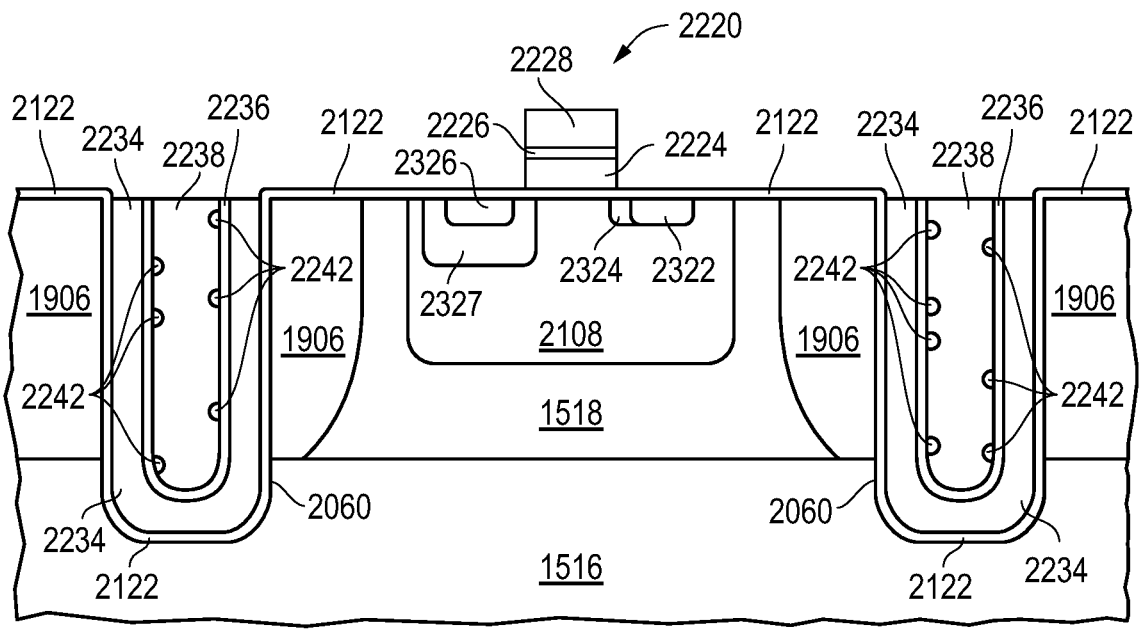
FIG. 23 includes an illustration of a cross-sectional view of the workpiece of FIG. 22 after forming a substantially completed nonvolatile memory cell.

FIG. 23 includes a cross-sectional view after the NVM cell is formed. In the embodiment as illustrated, the NVM cell is programmed by hot electron injection near the drain and erased using Fowler-Nordheim tunneling between the floating gate electrode 2224 and the source of the NVM cell.

A drain region 2322 and a halo region 2324 can be formed within the well region 2108. The drain region 2322 has a conductivity type opposite that of the semiconductor layer 1518. An ohmic contact can subsequently be made to the drain region 2322. In an embodiment, the drain region 2322 may have a depth in a range from 0.05 micron to 0.5 micron, and in the same or a different embodiment, the dopant concentration can be at least $1\times10^{19}$ atoms/cm$^3$. The halo region 2324 can help increase the electrical field adjacent to drain region 2322 and help to generate more hot electrons near the drain region 2322 during programming. The halo region 2324 extends laterally closer to a source for the NVM cell. The halo region 2324 has a conductivity type opposite that of the drain region 2322. In an embodiment, the halo region 2324 may have a depth in a range from 0.2 micron to 0.9 micron, and in the same or a different embodiment, the dopant concentration can be in a range from $1\times10^{15}$ atoms/cm$^3$ to $1\times10^{17}$ atoms/cm$^3$. In an embodiment, the halo region 2324 can be formed using a tilt angle implant to allow the halo region 2324 to extend further under the gate stack 2220.

The source of the NVM cell includes a lightly doped and relatively deeper source region 2327 and a heavily doped and relatively shallower source region 2326. The relatively deeper doped region 2327 allows for a sufficiently high voltage difference between the control gate electrode 2228 and relatively shallower source region 2326 during erasing without causing premature breakdown between the source and the semiconductor layer 1518.

The relatively deeper source region 2327 and the relatively shallower source regions 2326 have a conductivity type opposite that of the well region 2108. In an embodiment, the relatively deeper source region 2327 may have a depth in a range from 0.5 micron to 2.0 microns, and in the same or a different embodiment, the dopant concentration may be in a range from $1\times10^{15}$ atoms/cm$^3$ to $1\times10^{17}$ atoms/cm$^3$. An ohmic contact may be subsequently made to the relatively shallower source region 2326. The relatively shallow source region 2326 can have the same conductivity type and any of the depths and dopant concentrations as previously described with respect to the drain region 2322. The relatively shallower source region 2326 may have substantially the same or a significantly different depth as the drain region 2322. The relatively shallower source region 2326 may have substantially the same or a significantly different dopant concentration as the drain region 2322. In a particular embodiment, the relatively shallower source region 2326 may have a dopant concentration that is at least one order of magnitude higher than the dopant concentration of the relatively deeper source region 2327.

If needed or desired, sidewall spacers (not illustrated) may be formed along sides of the gate stack 2220. Such sidewall spacers may be useful for transistor structures formed outside the NVM array. Such transistor structures may include lightly-doped drain (LDD) regions and be parts of transistors used to circuits to control, provide data, erase data, or retrieve data from the NVM cells within the NVM array. A silicide mask and silicidation process may be performed before forming an ILD layer or may be performed as part of the contact formation process sequence, if silicidation is desired.

Figure 24:
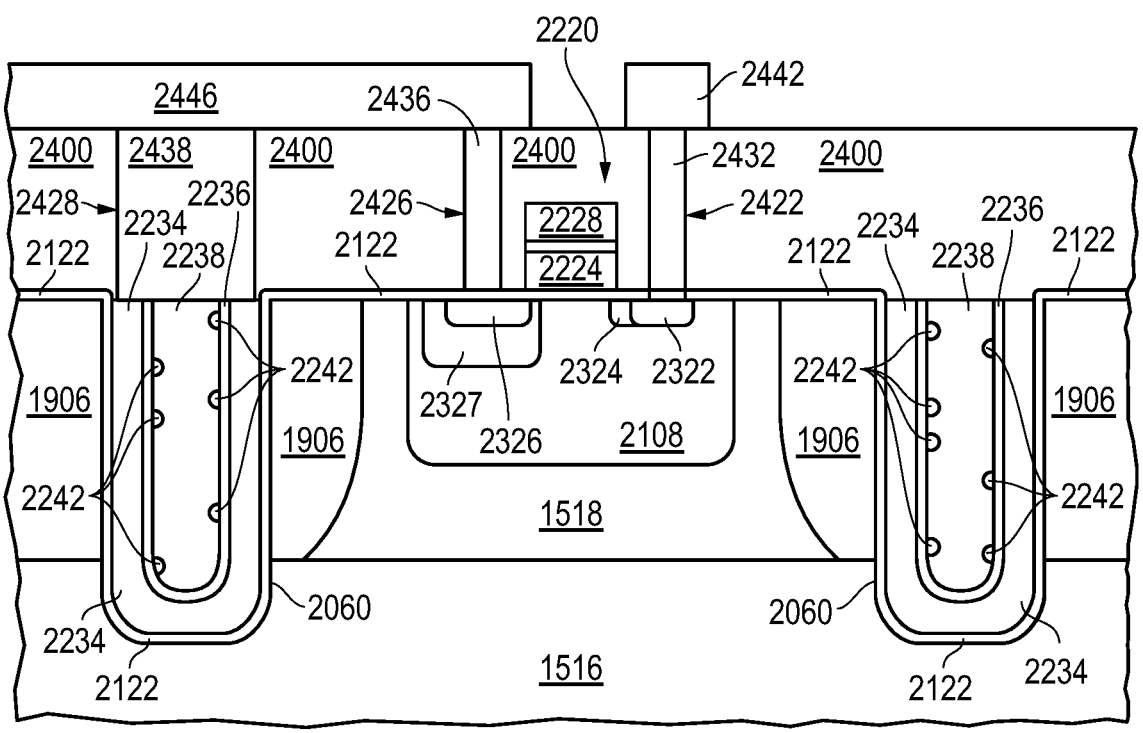
FIG. 24 includes an illustration of a cross-sectional view of the workpiece of FIG. 23 after forming a substantially completed electronic device.

FIG. 24 includes a cross-sectional view of a substantially completed electronic device. From the time the control gate layer 2128 is formed until a substantially completed electronic device is formed, one or more thermal operations may be performed. Much of the prior discussion regarding the voids 542 also applies to the voids 2242. The member 2236 helps to keep the voids from reaching the member 2234 (a portion of the floating gate layer 2124, and thus, the voids 2242 do not migrate to member 2234. The voids 2242 do not reach the surface of the member 2234 closer to the sidewall 2062 of the trench 2060. Thus, even for combinations of a relatively high temperature (at least 1000° C.) and a relatively longer time period (at least 30 minutes), the voids 2242 remain contained within the member 2238.

Referring to FIG. 24, an ILD layer 2400 can be formed and patterned to define contact openings 2422, 2426, and 2428. The ILD layer 2400 can include any of the compositions and be formed using any of the techniques as previously described with respect to the ILD layer 1840. The contact opening 2422 allows an electrical connection to be made to the drain region 2322, the contact opening 2426 allows an electrical connection to be made to the relatively shallow source region 2326, and the opening 2428 allows an electrical connection to be made to the member 2234, which is an electrode of the capacitor. The contact opening 2428 can expose the member 2238. In another embodiment, the contact opening 2428 may not expose the member 2238. After reading this specification, skilled artisans will be able to determine whether member 2238 should be exposed.

A conductive layer including one or more films can be formed over the workpiece and within the contact openings 2422, 2426, and 2428. Portions lying outside the contact openings 2422, 2426, and 2428 can be removed to form the conductive plugs 2432, 2436, and 2438. Another conductive layer including one or more films can be formed over the workpiece and patterned to define interconnects 2442 and 2446. As illustrated in FIG. 24, the interconnect 2442 is electrically connected to the drain region 2322 via the conductive plug 2432, and the interconnect 2442 is coupled to a $V_{DD}$ terminal. The interconnect 2446 is electrically connected to the heavily doped source region 2326 via the conductive plug 2436, is electrically connected to the member 2234 via the conductive plug 2438, and is coupled to a $V_{SS}$ terminal. In an embodiment, the buried conductive region 1516 can be coupled to the $V_{DD}$ terminal. Although not illustrated, the control gate electrode 2228 can be couped to a conductive plug that is electrically connected to a gate terminal for the NVM array.

The capacitor includes the member 2234 (a portion of the floating gate layer within the trench 2060), the tunnel dielectric layer 2122, the sinker region 1906, and, depending on the depth of the trench 2060, the buried conductive region 1516. If the bottom of the trench 2060 is within the sinker region 1906, the buried conductive region 1516 may not be part of the capacitor. The member 2234 is an electrode of the capacitor and is coupled to the $V_{SS}$, the tunnel dielectric layer 2122 within the trench 2060 is a capacitor dielectric for the capacitor, and the sinker region 1906 and the buried conductive region 1516, if the trench 2060 extend to the buried conductive region 1516, form the other electrode for the capacitor.

The capacitance of the capacitor can be more uniform from substrate to substrate and from production lot to production lot because voids that may be present within the member 2238 (a portion of the control gate layer within the trench 2060) do not migrate into the member 2234 due to the presence of the member 2236 (a portion of the inter-gate dielectric layer within the trench 2060) that acts as a barrier layer.

The concepts as described herein may be used for many other applications. After reading this specification, skilled artisans will appreciate that particular structures can be integrated into a process flow to achieve a void-free semiconductor layer that can be used to dope adjacent portions of a substrate along a sidewall of a trench, a capacitor formed within the trench, and potentially for other uses.

Embodiments described above can allow an electronic device to have a void-free semiconductor layer within a trench. The void-free semiconductor layer helps to provide electrical characteristics for the electronic device that vary less from substrate to substrate and from production lot to production lot. A barrier layer can help to keep voids that may form in one semiconductor layer from reaching a different semiconductor layer. Alternatively, none of the semiconductor layers fills substantially all of a remaining part of a trench, and thus, a seam or voids do not form within any of the semiconductor layers. For example, one or more layers having a base semiconductor material can be formed within a trench, and a layer that does not include a base semiconductor material (for example, an oxide, a nitride, or an oxynitride) can partly or substantially fill a remaining portion of the trench. The concepts as described herein are well suited to base semiconductor materials that can form a single element monocrystalline semiconductor layer, such as Si or Ge.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. A process of forming an electronic device can include patterning a substrate to define a trench having a sidewall; forming a first semiconductor layer within the trench and along the sidewall; forming a barrier layer within the trench after forming the first semiconductor layer; forming a second semiconductor layer within the trench after forming the barrier layer, wherein within the trench, first and second portions of the second semiconductor layer contact each other adjacent to a vertical centerline of the trench; and exposing the second semiconductor layer to radiation sufficient to allow a void within second semiconductor layer to migrate toward the barrier layer.

Embodiment 2. The process of Embodiment 1 further includes removing a portion of the first semiconductor layer that overlies a primary surface of the substrate before forming the second semiconductor layer.

Embodiment 3. The process of Embodiment 1 further includes diffusing a dopant from the first semiconductor layer into the substrate.

Embodiment 4. The process of Embodiment 1 further includes removing a portion of the second semiconductor layer to form a gate electrode of a transistor.

Embodiment 5. The process of Embodiment 4, wherein forming the barrier layer includes forming a dielectric layer.

Embodiment 6. The process of Embodiment 1 further includes polishing the second semiconductor layer to remove a portion of the second semiconductor overlying a primary surface of the substrate.

Embodiment 7. The process of Embodiment 1, wherein exposing the second semiconductor layer to the radiation includes exposing the second semiconductor layer to a temperature of at least 600° C. for a time period of at least 5 minutes.

Embodiment 8. The process of Embodiment 7, wherein the temperature is less than a melting or sublimation point of the second semiconductor layer.

Embodiment 9. The process of Embodiment 7, wherein the time period is at most 6 hours.

Embodiment 10. The process of Embodiment 1, wherein, in a finished electronic device, the process is performed such that the void contacts the barrier layer.

Embodiment 11. The process of Embodiment 1 further includes forming a conductive member that electrically connects the first semiconductor layer and the second semiconductor layer to each other.

Embodiment 12. The process of Embodiment 1, wherein forming the second semiconductor layer includes a semiconductor base material that includes a Group 14 element.

Embodiment 13. The process of Embodiment 1, wherein patterning the substrate includes (1) etching the substrate to define a portion of the trench including a portion of the sidewall of the trench; (2) forming a passivation layer along the portion of the sidewall of the trench; and iterating actions (1) and (2) until a desired depth of the trench is achieved.

Embodiment 14. The process of Embodiment 1, wherein forming the first semiconductor layer includes depositing a first silicon layer, the process further includes etching the first silicon layer, such that the first silicon layer does not overlie the primary surface of the substrate, forming the barrier layer includes forming a thermal oxide layer, wherein forming the barrier layer is performed after etching the first silicon layer, forming the second semiconductor layer includes depositing a second silicon layer, and exposing the second semiconductor layer to the radiation includes exposing the second silicon layer to a temperature in a range from 900° C. to 1200° C. for a time period in a range from 10 minutes to 120 minutes. The process further includes polishing to remove the second silicon layer overlying the primary surface.

Embodiment 15. A process of forming an electronic device can include patterning a substrate to define a trench having a sidewall; forming a semiconductor layer within the trench and along the sidewall, wherein the semiconductor layer is an only semiconductor layer formed within the trench; forming an insulating layer that substantially fills a remaining portion of the trench; and exposing the semiconductor layer to radiation sufficient to allow self-diffusion of a base semiconductor material within the semiconductor layer. In a finished electronic device, within the trench, no void is not completely surrounded by the semiconductor layer.

Embodiment 16. An electronic device can include a substrate that defines a trench having a sidewall; a first semiconductor layer within the trench and along the sidewall of the trench, wherein the first semiconductor layer is substantially free of any void; a barrier layer within the trench; and a second semiconductor layer within the trench The barrier layer is disposed between the first semiconductor layer and the second semiconductor layer, first and second portions of the second semiconductor layer contact each other at a location closer to a vertical centerline of the trench as compared to the barrier layer, and a void is within the second semiconductor layer, and, at a particular elevation, a third portion of the second semiconductor layer is disposed between the void and the vertical centerline of the second semiconductor layer.

Embodiment 17. The electronic device of Embodiment 16, wherein the trench has a first width near a primary surface of the substrate and a second width farther from the primary surface, wherein the first width is less than the second width.

Embodiment 18. The electronic device of Embodiment 16, wherein the barrier layer includes a first oxide film, a nitride film, and a second oxide film, wherein the nitride film is disposed between the first oxide film and the second oxide film.

Embodiment 19. The electronic device of Embodiment 16, wherein the first semiconductor layer is a first silicon layer, and the second semiconductor layer is a second silicon layer.

Embodiment 20. The electronic device of Embodiment 19 further includes a buried region that contacts the first semiconductor layer or the second semiconductor layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device, the process comprising:
    patterning a substrate to define a trench having a sidewall;
    forming a first semiconductor layer within the trench and along the sidewall;
    forming a barrier layer within the trench after forming the first semiconductor layer;
    forming a second semiconductor layer within the trench after forming the barrier layer, wherein within the trench, first and second portions of the second semiconductor layer contact each other adjacent to a vertical centerline of the trench; and
    exposing the second semiconductor layer to radiation sufficient to allow a void within second semiconductor layer to migrate toward the barrier layer.

2. The process of claim 1, further comprising removing a portion of the first semiconductor layer that overlies a primary surface of the substrate before forming the second semiconductor layer.

3. The process of claim 1, further comprising diffusing a dopant from the first semiconductor layer into the substrate.

4. The process of claim 1, further comprising polishing the second semiconductor layer to remove a portion of the second semiconductor layer overlying a primary surface of the substrate.

5. The process of claim 1, wherein, in a finished electronic device, the process is performed such that the void contacts the barrier layer.

6. The process of claim 1, further comprising forming a conductive member that electrically connects the first semiconductor layer and the second semiconductor layer to each other.

7. The process of claim 1, wherein forming the second semiconductor layer includes a semiconductor base material that includes a Group 14 element.

8. The process of claim 1, wherein patterning the substrate comprises:
    (1) etching the substrate to define a portion of the trench including a portion of the sidewall of the trench;
    (2) forming a passivation layer along the portion of the sidewall of the trench; and
    iterating actions (1) and (2) until a desired depth of the trench is achieved.

9. The process of claim 1, wherein:
    forming the first semiconductor layer comprises depositing a first silicon layer,
    the process further comprises etching the first silicon layer, such that the first silicon layer does not overlie a primary surface of the substrate,
    forming the barrier layer comprises forming a thermal oxide layer, wherein forming the barrier layer is performed after etching the first silicon layer,
    forming the second semiconductor layer comprises depositing a second silicon layer,
    exposing the second semiconductor layer to the radiation comprises exposing the second silicon layer to a temperature in a range from 900° C. to 1200° C. for a time period in a range from 10 minutes to 120 minutes, and
    the process further comprises polishing to remove the second silicon layer overlying the primary surface.

10. The process of claim 1, further comprising removing a portion of the second semiconductor layer to form a gate electrode of a transistor.

11. The process of claim 10, wherein forming the barrier layer comprises forming a dielectric layer.

12. The process of claim 1, wherein exposing the second semiconductor layer to the radiation comprises exposing the second semiconductor layer to a temperature of at least 600° C. for a time period of at least 5 minutes.

13. The process of claim 12, wherein the temperature is less than a melting or sublimation point of the second semiconductor layer.

14. The process of claim 12, wherein the time period is at most 6 hours.

15. A process of forming an electronic device, the process comprising:
- patterning a substrate to define a trench having a sidewall;
- forming a semiconductor layer within the trench and along the sidewall, wherein the semiconductor layer is an only semiconductor layer formed within the trench;
- forming an insulating layer that substantially fills a remaining portion of the trench; and
- exposing the semiconductor layer to radiation sufficient to allow self-diffusion of a base semiconductor material within the semiconductor layer,
- wherein in a finished electronic device, within the trench, no void is not completely surrounded by the semiconductor layer.

16. An electronic device, comprising:
- a substrate that defines a trench having a sidewall;
- a first semiconductor layer within the trench and along the sidewall of the trench, wherein the first semiconductor layer is substantially free of any void;
- a barrier layer within the trench; and
- a second semiconductor layer within the trench, wherein:
  - the barrier layer is disposed between the first semiconductor layer and the second semiconductor layer,
  - first and second portions of the second semiconductor layer contact each other at a location closer to a vertical centerline of the trench as compared to the barrier layer, and
  - a void is within the second semiconductor layer and closer to the barrier layer than the vertical centerline, and, at a particular elevation, a third portion of the second semiconductor layer is disposed between the void and the vertical centerline of the second semiconductor layer.

17. The electronic device of claim 16, wherein the trench has a first width near a primary surface of the substrate and a second width farther from the primary surface, wherein the first width is less than the second width.

18. The electronic device of claim 16, wherein the barrier layer includes a first oxide film, a nitride film, and a second oxide film, wherein the nitride film is disposed between the first oxide film and the second oxide film.

19. The electronic device of claim 16, wherein the first semiconductor layer is a first silicon layer, and the second semiconductor layer is a second silicon layer.

20. The electronic device of claim 19, further comprising a buried region that contacts the first semiconductor layer or the second semiconductor layer.

* * * * *